United States Patent
Lyon et al.

(10) Patent No.: US 9,566,609 B2
(45) Date of Patent: Feb. 14, 2017

(54) SURFACE NANOREPLICATION USING POLYMER NANOMASKS

(71) Applicants: Jennifer Lynn Lyon, Painted Post, NY (US); Jianguo Wang, Horseheads, NY (US); Ruchirej Yongsunthon, Painted Post, NY (US); Ying Zhang, Horseheads, NY (US)

(72) Inventors: Jennifer Lynn Lyon, Painted Post, NY (US); Jianguo Wang, Horseheads, NY (US); Ruchirej Yongsunthon, Painted Post, NY (US); Ying Zhang, Horseheads, NY (US)

(73) Assignee: Corning Incorporated, Corning, NY (US)

(*) Notice: Subject to any disclaimer, the term of this patent is extended or adjusted under 35 U.S.C. 154(b) by 600 days.

(21) Appl. No.: 13/748,827

(22) Filed: Jan. 24, 2013

(65) Prior Publication Data

US 2014/0205766 A1   Jul. 24, 2014

(51) Int. Cl.
*C08J 7/04* (2006.01)
*B05D 5/00* (2006.01)
(Continued)

(52) U.S. Cl.
CPC .............. *B05D 5/00* (2013.01); *B82Y 10/00* (2013.01); *B82Y 40/00* (2013.01); *G03F 7/0002* (2013.01)

(58) Field of Classification Search
CPC ......... B05D 5/00; G03F 7/0002; B82Y 40/00; B82Y 10/00
(Continued)

(56) References Cited

U.S. PATENT DOCUMENTS 6,306,563 B1 * 10/2001 Xu et al. .................... 430/321
7,363,854 B2 * 4/2008 Sewell ......................... 101/41
(Continued)

FOREIGN PATENT DOCUMENTS

| EP | 2 594 995 | 5/2013 |
|---|---|---|
| WO | 2013/050338 | 4/2013 |
| WO | 2013/152928 | 10/2013 |

OTHER PUBLICATIONS

C. Park, et al., "Enabling nanotechnology with self assembled block copolymer patterns", *Polymer*, 2003, vol. 44, pp. 6725-6760.
(Continued)

*Primary Examiner* — Robert S Walters, Jr.
(74) *Attorney, Agent, or Firm* — Payal A. Patel

(57) ABSTRACT

Methods for replicating a nanopillared surface include applying a nanopillar-forming material to a surface of a replica substrate to form a precursor layer on the replica-substrate surface. A template surface of a nanomask may be contacted to the precursor layer. The nanomask may include a self-assembled polymer layer on a nanomask-substrate surface, the template surface being defined in the self-assembled polymer layer. The self-assembled polymer layer may have nano-sized pores with openings at the template surface. The precursor layer may be cured while the template surface remains in contact with the precursor layer. The nanomask is removed to expose a nanopillared surface having a plurality of nanopillars on the replica-substrate surface. The nanopillars on the replica-substrate surface may correspond to the pores in the template surface. Nanopillared surfaces may be replicated on one side of the replica substrate or on two opposing sides of the replica substrate.

17 Claims, 12 Drawing Sheets

(51) Int. Cl.
G03F 7/00 (2006.01)
B82Y 10/00 (2011.01)
B82Y 40/00 (2011.01)

(58) Field of Classification Search
USPC .......................................................... 427/510
See application file for complete search history.

(56) References Cited

U.S. PATENT DOCUMENTS

| | | | |
|---|---|---|---|
| 2007/0254278 A1* | 11/2007 | DeSimone et al. | 435/5 |
| 2008/0318005 A1 | 12/2008 | Millward | 428/172 |
| 2009/0078673 A1 | 3/2009 | Kihara et al. | 216/11 |
| 2009/0092803 A1 | 4/2009 | Bita et al. | 428/209 |
| 2009/0236309 A1 | 9/2009 | Millward et al. | 216/39 |
| 2009/0274887 A1 | 11/2009 | Millward et al. | 428/221 |
| 2011/0024950 A1 | 2/2011 | Kruglick | 264/496 |
| 2011/0250745 A1 | 10/2011 | Millward et al. | 438/591 |
| 2012/0009390 A1 | 1/2012 | Yang et al. | 428/179 |
| 2012/0196089 A1 | 8/2012 | Yang et al. | 428/156 |
| 2012/0196094 A1 | 8/2012 | Xu et al. | 428/195 |
| 2013/0126473 A1 | 5/2013 | Dobisz et al. | 216/49 |
| 2014/0011013 A1 | 1/2014 | Jin et al. | 428/297.4 |

OTHER PUBLICATIONS

S. Krishnamoorthy, et al., "Wafer-Level Self-Organized Copolymer Templates for Nanolithography with Sub-50 nm Feature and Spatial Resolutions", *Adv. Funct. Mater.*, 2011, vol. 21, pp. 1102-1112.

PCT Application No. PCT/US2014/012225, filed Jan. 21, 2014, PCT Search Report dated Jun. 17, 2014.

J. Gao, et al., "Fabrication of polymer antireflective coatings by self-assembly of supramolecular block copolymer", *Polymer*, 2010, vol. 50, pp. 2683-2689.

W. Joo, et al., "Block Copolymer Film with Sponge-Like Nanoporous Structure for Antireflective Coating", *Langmuir*, 2006, vol. 22, pp. 7960-7963.

C.Y. Kuo, et al., "A Facile Route to Create Surface Porous Polymer Films via Phase Separation for Antireflection Applications", *Applied Materials & Interfaces*, 2009, vol. 1, No. 1, pp. 72-75.

W. Lee, et al., "A simple method for creating nanoporous block-copolymer thin films", *Polymer*, 2010, vol. 51, pp. 2376-2382.

N. Lefevre, et al., "Self-Assembly in Thin Films of Mixtures of Block Copolymers and Homopolymers Interacting by Hydrogen Bonds", *Macromolecules*, 2010, vol. 43, pp. 7734-7743.

X. Li, et al., "Broadband antiflection of block copolymer/homopolymer blend films with gradient refractive index structures", *Journal of Materials Chemistry*, 2011, vol. 21, pp. 5817-5827.

X. Li, et al., "Porous Polymer Films with Gradient-Refractive-Index Structure for Broadband and Omnidirectional Antireflection Coatings", *Advanced Functional Materials*, 2010, vol. 20, pp. 259-265.

Y. Lu, et al., "pH-Induced Antireflection Coatings Derived From Hydrogen-Bonding-Directed Multilayer Films", *Langmuir*, 2010, vol. 26, No. 22, pp. 17749-17755.

B. Päivänranta, et al., "Nanofabrication of Broad-Band Antireflective Surfaces Using Self-Assembly of Block Copolymers", *ACS Nano*, 2011, vol. 5, No. 3, 2011, pp. 1860-1864.

C. Park et al., "Enabling nanotechnology with self assembled block copolymer patterns", Polymer, 2003, vol. 44, No. 22, pp. 6725-6760.

M. Park, et al., "Large Area Dense Nanoscale Patterning of Arbitrary Surfaces", *Applied Physics Letters*, 2001, vol. 79, pp. 257-259.

Y. Qiao, et al., "Block Polymer Templated Etching on Silicon", 2007, *Nano Letters*, vol. 7, No. 2, pp. 464-469.

S. Walheim, et al., "Nanophase-Separated Polymer Films as High-Performance Antireflection Coatings", *Science*, 1999, vol. 283, pp. 520-522.

* cited by examiner

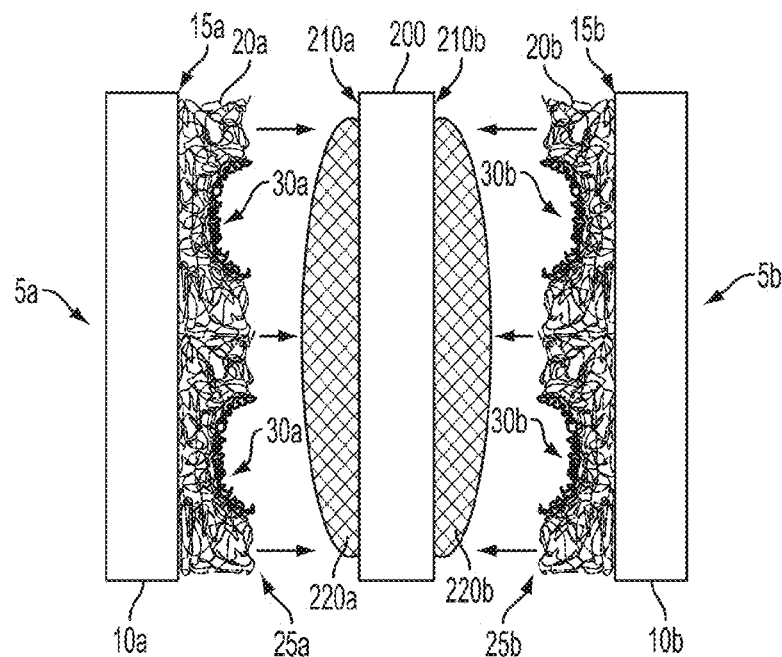
FIG. 3A
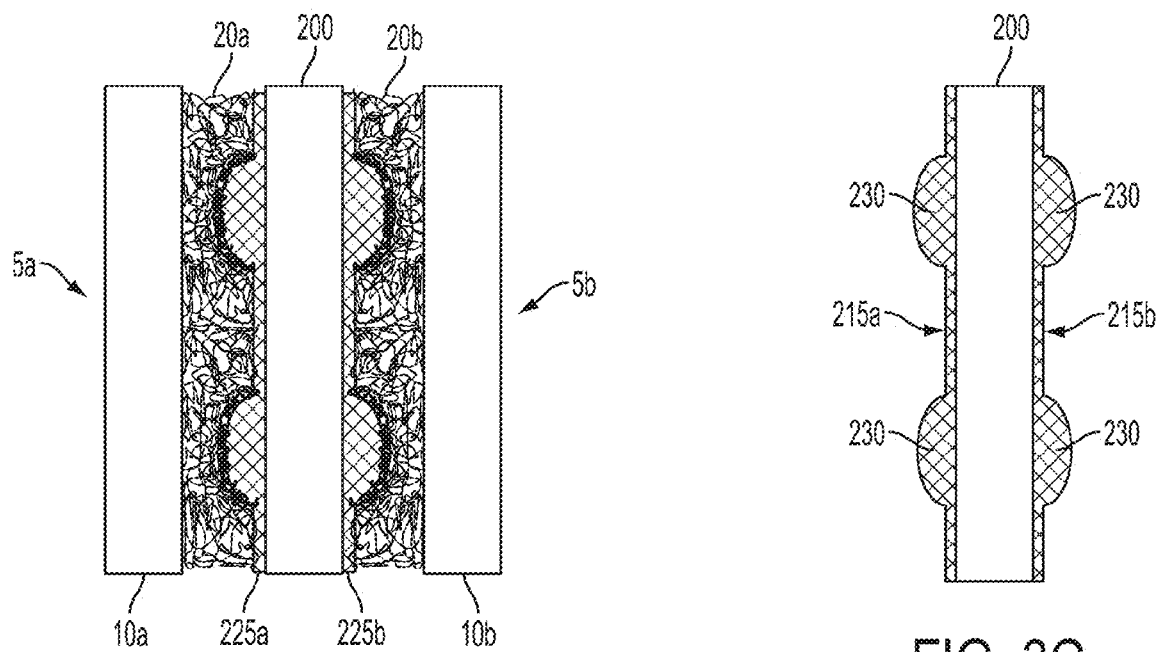
FIG. 3B
FIG. 3C

SURFACE NANOREPLICATION USING POLYMER NANOMASKS

BACKGROUND

Field

The present specification generally relates to materials for and methods of masking surfaces and forming nanoscale three-dimensional structures, and more specifically, to block copolymers in combination with homopolymers for use in forming nanomasks and dimensionally-modified surfaces. Methods of making and using related devices are also disclosed.

Technical Background

Engineering nano-textured post or hole patterns onto surfaces at low cost is commercially desirable for many applications, including anti-glare, anti-smudge de-wetting properties associated with modern touch-screens, and anti-reflective and scattering optical properties related to photovoltaic glass substrates. Previously, it has been a challenge to produce commercially-viable, cost-effective nanoscale patterns having specific pitch and diameter requirements over large areas.

SUMMARY

Embodiments of the present disclosure relate to surface nanofabrication techniques having low production costs. Some embodiments include depositing a block copolymer and homopolymer mixture as a thin film onto a substrate, and further processing the thin film to form nanoholes into which a material may be deposited to produce a textured substrate surface having elements with dimensions on the nanometer scale. The processes involved are scalable to large surface areas, may be performed at room temperature, and use modest polymer removal and thin film deposition processes to enable large-scale nano-textured surface fabrication at lower manufacturing costs.

According to some embodiments, methods for replicating a nanopillared surface are described. The methods may include applying a nanopillar-forming material to a replica-substrate surface of a replica substrate to form a precursor layer on the replica-substrate surface. The methods may also include contacting a template surface of a nanomask to the precursor layer. The nanomask may include a self-assembled polymer layer on a nanomask-substrate surface of a nanomask substrate. The template surface may be defined in the self-assembled polymer layer opposite the nanomask-substrate surface. The self-assembled polymer layer may have defined therein a plurality of pores with openings at the template surface. The methods may also include curing the precursor layer while the template surface remains in contact with the precursor layer to form a cured precursor layer between the template surface and the replica-substrate surface. Then, the nanomask may be removed to expose a nanopillared surface having a plurality of nanopillars on the replica-substrate surface. The plurality of nanopillars on the replica-substrate surface may correspond to the plurality of pores in the template surface.

In some embodiments, the methods for replicating the nanopillared surface may also include preparing the nanomask. The nanomask may be prepared by applying a polymer solution to the nanomask-substrate surface of the nanomask substrate. The polymer solution may contain an amphiphilic block copolymer having hydrophobic blocks and hydrophilic blocks; a hydrophilic homopolymer that is chemically compatible with the hydrophilic blocks of the amphiphilic block copolymer; and an application solvent. The application solvent may be removed from the polymer solution to cause the amphiphilic block copolymer and the hydrophilic homopolymer in the polymer solution to self-assemble on the nanomask substrate surface to form the self-assembled polymer layer defining the template surface opposite the nanomask substrate surface. The self-assembled polymer layer may have hydrophobic domains adjacent to the nanomask substrate surface and hydrophilic domains. The hydrophilic domains may extend into the self-assembled polymer layer from the template surface. Once the self-assembled polymer layer is formed, at least a portion of the hydrophilic domains may be removed to form the plurality of pores in the self-assembled polymer layer with openings at the template surface.

According to further embodiments, methods for fabricating a nanopillared surface on opposing surfaces of a replica substrate are described. The methods may include applying a first nanopillar-forming material to a first replica-substrate surface of the replica substrate to form a first precursor layer on the first replica-substrate surface. Then, a first template surface of a first nanomask may be contacted to the first precursor layer. The first nanomask may include a first self-assembled polymer layer on a first nanomask-substrate surface of a first nanomask substrate, the first template surface being defined in the first self-assembled polymer layer opposite the first nanomask-substrate surface. The first self-assembled polymer layer may have defined therein a plurality of pores with openings at the first template surface. The methods may include also applying a second nanopillar-forming material to a second replica-substrate surface of the replica substrate opposite the first replica-substrate surface to form a second precursor layer on the second replica-substrate surface. Then, a second template surface of a second nanomask may be contacted to the second precursor layer, the second nanomask comprising a second self-assembled polymer layer on a second nanomask-substrate surface of a second nanomask substrate. The second template surface may be defined in the second self-assembled polymer layer opposite the second nanomask-substrate surface. The second self-assembled polymer layer may have defined therein a plurality of pores with openings at the second template surface. The first precursor layer may be cured while the first template surface remains in contact with the first precursor layer to form a first cured precursor layer between the first template surface and the first replica-substrate surface. Likewise, the second precursor layer may be cured while the second template surface remains in contact with the second precursor layer to form a second cured precursor layer between the second template surface and the second replica-substrate surface. The first nanomask may be removed to expose a first nanopillared surface comprising a plurality of nanopillars on the first replica-substrate surface, and the second nanomask may be removed to expose a second nanopillared surface comprising a plurality of nanopillars on the second replica-substrate surface. The plurality of nanopillars on the first replica-substrate surface may correspond to the plurality of pores in the first template surface, and the plurality of nanopillars on the second replica-substrate surface may correspond to the plurality of pores in the second template surface.

Additional features and advantages of the embodiments described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

FIG. 3A schematically depicts contacting of a first template surface of a first nanomask to a first replica-substrate surface having thereon a first precursor layer of a first nanopillar-forming material, while a second template surface of a second nanomask is contacted to a second replica-substrate surface having thereon a second precursor layer of a second nanopillar-forming material, according to embodiments described herein;

FIG. 3B schematically depicts curing of the first precursor layer and the second precursor layer;

FIG. 3C schematically depicts a replica substrate having nanopillared surfaces on opposing sides, formed according to embodiments of methods described herein;

DETAILED DESCRIPTION

Reference will now be made in detail to embodiments of methods for fabricating nanopillared surfaces. Initially, exemplary embodiments such methods will be described in summary with reference to FIGS. 1A-5B. Then, various embodiments of methods for fabricating nanopillared surfaces will be described in detail to highlight particular features related to the methods, components and apparatus involved in carrying out the methods, steps performed during the methods, and results attainable from using the methods.

Figure 1A:
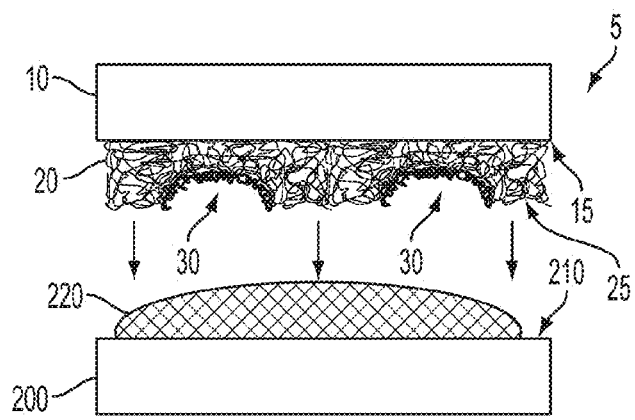
FIG. 1A schematically depicts contacting of a template surface of a nanomask to a replica-substrate surface having thereon a precursor layer of a nanopillar-forming material, according to embodiments described herein.

Referring to FIG. 1A, the methods described herein for replicating a nanopillared substrate surface may include applying a nanopillar-forming material to a replica-substrate surface 210 of a replica substrate 200 to form a precursor layer 220 on the replica-substrate surface 210. A template surface 25 of a nanomask 5 to the precursor layer. The nanomask 5 may include a self-assembled polymer layer 20 on a nanomask-substrate surface 15 of a nanomask substrate 10. The template surface 25 may be defined in the self-assembled polymer layer 20 opposite the nanomask-substrate surface 15. The self-assembled polymer layer 20 may have defined therein a plurality of pores 30 with openings at the template surface 25.

Figure 1B:
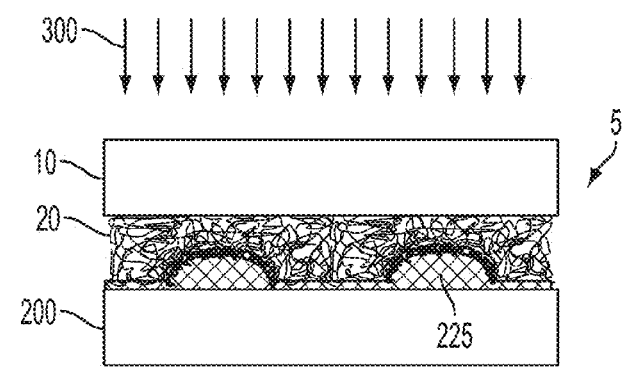
FIG. 1B schematically depicts curing of the precursor layer while the template surface remains in contact with the precursor layer to form a cured precursor layer between the template surface and the replica-substrate surface, according to embodiments herein.

Referring to FIGS. 1A and 1B, the precursor layer 220 may be cured by applying curing energy 300 such as heat or UV radiation, for example, while the template surface 25 remains in contact with the precursor layer 220 to form a cured precursor layer 225 between the template surface 25 and the replica-substrate surface 210 or the replica substrate 200.

Figure 1C:
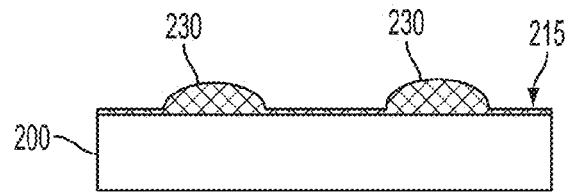
FIG. 1C schematically depicts a nanopillared surface formed according to embodiments of methods described herein.
Figure 2A:
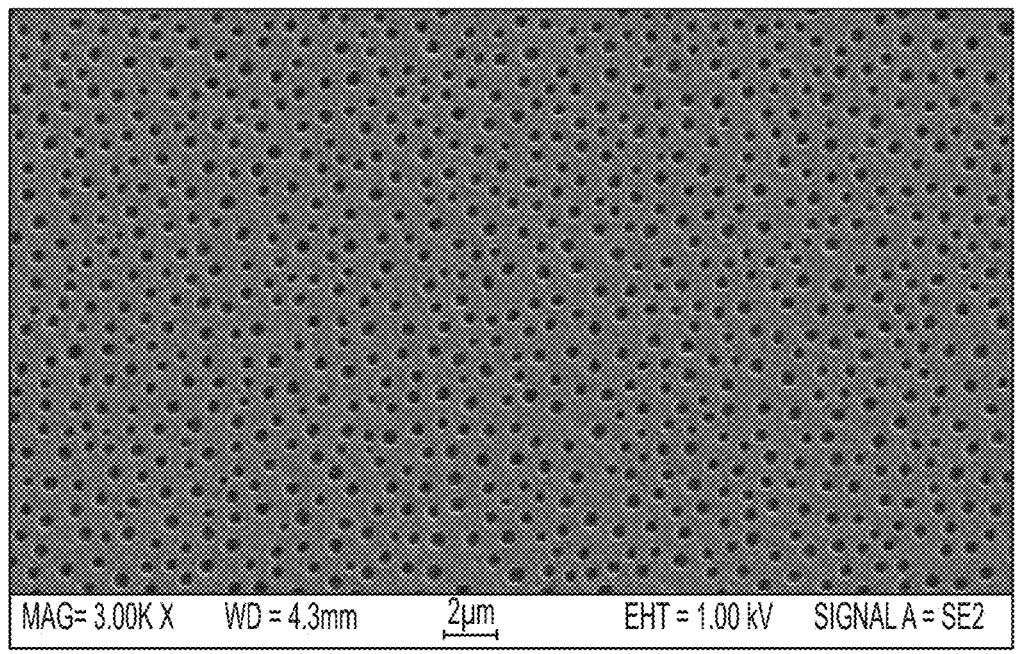
FIG. 2A is a scanning-electron micrograph of a nanomask having a plurality of pores in a template surface.
Figure 2B:
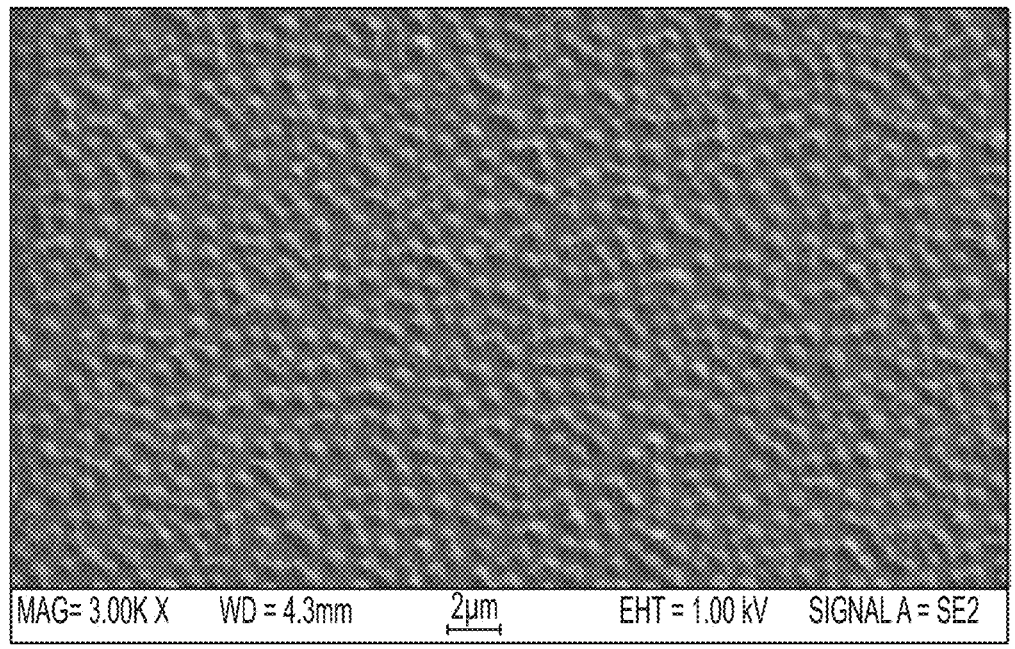
FIG. 2B is a scanning-electron micrograph of a glass substrate having a nanopillared surface prepared using the nanomask of FIG. 3A according to embodiments described herein.

Referring to FIGS. 1B and 1C, the nanomask 5 may be removed to expose a nanopillared surface 215 having a plurality of nanopillars 230 on the replica-substrate surface 210. The plurality of nanopillars 230 of the nanopillared surface 215 may correspond to the plurality of pores 30 in the template surface 25 of the self-assembled polymer layer 20. As illustrative of this correspondence, the scanning-electron micrograph of FIG. 2A shows a template surface of a nanomask such as the nanomask 5 schematically depicted in FIGS. 1A-1C, and the scanning-electron micrograph of FIG. 2B shows nanopillared surface from the nanomask analogously to the embodiment of the method schematically depicted in FIGS. 1A-1C.

Referring to FIGS. 3A-3C, an illustrative embodiment of methods for replicating nanopillared surfaces 215a, 215b onto opposing surfaces 210a, 210b of a replica substrate 200 is shown schematically. The schematic of FIG. 3A shows a first nanopillar-forming material that has been applied to a first replica-substrate surface 210a of the replica substrate 200 to form a first precursor layer 220a on the first replica-substrate surface 210a. A second nanopillar-forming material has been applied to a second replica-substrate surface 210b of the replica substrate 200 opposite the first replica-substrate surface 210a to form a second precursor layer 220b on the second replica-substrate surface 210b. Also shown in FIG. 2A is a first nanomask 5a, which may include a first self-assembled polymer layer 20a on a first nanomask-substrate surface 15a of a first nanomask substrate 10a. The first template surface 25a may be defined in the first self-assembled polymer layer 20a opposite the first nanomask-substrate surface 15a. The first self-assembled polymer layer 20a may have defined therein a plurality of pores 30a with openings at the first template surface 25a. Also shown in FIG. 2A is a second nanomask 5b, which may include a second self-assembled polymer layer 20b on a second nanomask-substrate surface 15b of a second nanomask substrate 10b. The second template surface 25b may be defined in the second self-assembled polymer 20b layer opposite the second nanomask-substrate surface 15b. The second self-assembled polymer 20b layer may have defined therein a plurality of pores 30b with openings at the second template surface 25b.

Referring to FIGS. 3A and 3B, the first template surface 25a of the first nanomask 5a may be contacted to the first precursor layer 220a. Likewise, the second template surface 25b of the second nanomask 5b may be contacted to the second precursor layer 220b. In the embodiment of FIG. 2B, the first nanomask 5a and the second nanomask 5b are contacted simultaneously to the first precursor layer 220a and the second precursor layer 220b, respectively. In other embodiments, the first nanomask 5a may be applied first, followed by curing of the first precursor layer 220a, and then the second nanomask 5b may be applied, followed by curing of the second precursor layer 220b. In still other embodiments, the first nanomask 5a may be applied first, followed by curing of the first precursor layer 220a, and then the first nanomask 5a may be reused as the second nanomask, followed by curing of the second precursor layer 220b.

The first precursor layer 220a may be cured while the first template surface 25a remains in contact with the first precursor layer 220a to form a first cured precursor layer 225a between the first template surface 25a and the first replica-substrate surface 210a. Likewise, the second precursor layer 220b may be cured while the second template surface 25b remains in contact with the second precursor layer 220b to form a second cured precursor layer 225b between the second template surface 25b and the second replica-substrate surface 210b. In exemplary embodiments, the precursor layers 220a, 220b may be cured by applying heat or UV radiation, for example.

Referring to FIGS. 3B and 3C, the first nanomask 5a may be removed to expose a first nanopillared surface 215a comprising a plurality of nanopillars 230 on the first replica-substrate surface 210a, and the second nanomask 5b may be removed to expose a second nanopillared surface 215b comprising a plurality of nanopillars 230 on the second replica-substrate surface 210b. The plurality of nanopillars 230 on the first replica-substrate surface 210a may correspond to the plurality of pores 30a in the first template surface 25a (FIG. 3A), and the plurality of nanopillars 230 on the second replica-substrate surface 210b may correspond to the plurality of pores 30b in the second template surface 25b (FIG. 3A).

Figure 4A:
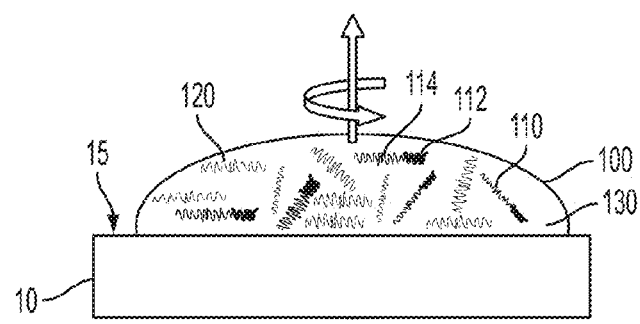
FIG. 4A schematically depicts an application of a polymer solution according to embodiments described herein.
Figure 4B:
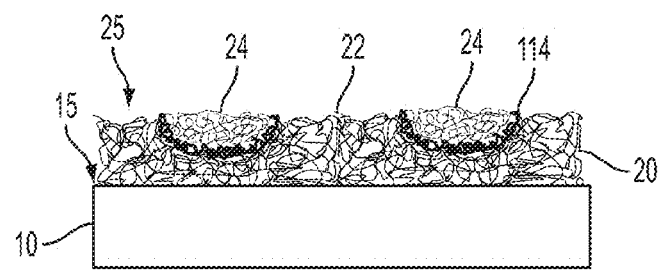
FIG. 4B schematically depicts a self-assembled polymer layer with hydrophilic and hydrophobic domains on a substrate surface.
Figure 4C:
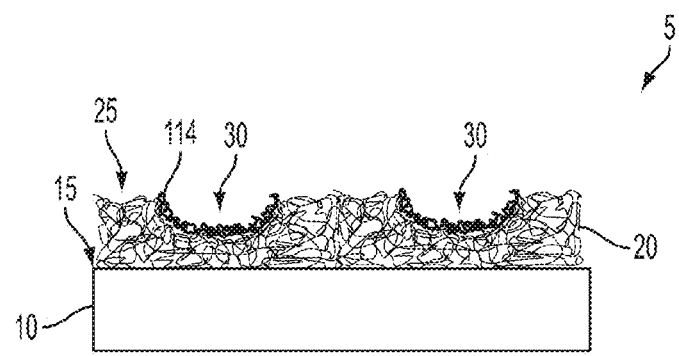
FIG. 4C schematically depicts a self-assembled polymer layer with pores formed after removal of hydrophilic domains.

Referring to the illustrative embodiment shown schematically in FIGS. 4A-4C, the methods described herein for replicating nanopillared surfaces may include additionally preparing the nanomask 5. As shown in FIG. 4A, preparing the nanomask 5 may include applying a polymer solution 100 to a nanomask-substrate surface 15 of a nanomask substrate 10. The polymer solution 100 may contain an amphiphilic block copolymer 110 having hydrophobic blocks 112 and hydrophilic blocks 114; a hydrophilic homopolymer 120 that is chemically compatible with the hydrophilic blocks 114 of the amphiphilic block copolymer 110; and an application solvent 130. The amphiphilic block copolymer 110 and the hydrophilic homopolymer 120 in the polymer solution 100 may be allowed to self-assemble on the nanomask-substrate surface 15 to form a self-assembled polymer layer 20. Self-assembly may occur when the application solvent 130 is removed by evaporation, for example.

The self-assembly of the amphiphilic block copolymer 110 and the hydrophilic homopolymer 120 is represented in FIG. 4B. The self-assembled polymer layer 20 may include hydrophobic domains 22 adjacent to the nanomask-substrate surface 15 and hydrophilic domains 24 extending into the self-assembled polymer layer from an template surface 25 of the self-assembled polymer layer 20 opposite the nanomask-substrate surface 15. Thereby, the self-assembly process may result in a transitional region between the hydrophobic domains 22 and the hydrophilic domains 24, the transitional region being made up from the hydrophilic blocks 114 of the amphiphilic block copolymer 110.

Referring to FIGS. 1B and 1C, preparing the nanomask 5 may further include removing at least a portion of the hydrophilic domains 24 to form a plurality of pores 30 in the template surface 25 of the self-assembled polymer layer 20. Examples of a porous surface structure such as the one represented in FIG. 4C are provided in the SEM micrographs of FIGS. 5A and 5B. The template surface 25 of the nanomask 5 prepared according to the embodiment of FIGS. 4A-4C may then be contacted to a precursor layer on a replica substrate, following the methods described above schematically with reference to FIGS. 1A-1C. Alternatively, multiple nanomasks prepared according to the embodiments of FIGS. 4A-4C may be contacted to precursor layers on opposing sides of a replica substrate, following the methods described above schematically with reference to FIGS. 3A-3C.

Having described in summary exemplary embodiments of methods for replicating nanopillared substrate surfaces, now various embodiments and modifications to the exemplary embodiments will be described in greater detail. In particular, methods for replicating a nanopillared surface onto a single side of a replica substrate will be described. It should be understood, however, that replication of nanopillared surfaces onto opposing sides of a single replica substrate may be accomplished using analogous methods by simply performing the replication on each side of the replica substrate, simultaneously (as in FIGS. 3A-3C) or, as described above, either sequentially using two different nanomasks, or sequentially using a single nanomask twice.

According to some embodiments, the methods for replicating nanopillared substrate surfaces may include applying a nanopillar-forming material to at least one replica-substrate surface of a replica substrate to form a precursor layer on the replica-substrate surface. The replica substrate or at least the replica-substrate surface may be any material that can be patterned by the methods embodied herein including, but not limited to, metals, metal oxides, polymers, silica, glass ceramics, ceramics, and glasses. Exemplary glasses include, without limitation, silicate glasses, borosilicate glasses, aluminosilicate glasses, aluminoborosilicate glasses, soda lime glasses, and Gorilla™ Glass (an alkali-metal aluminosilicate glass toughened by ion exchange of potassium for sodium), for example. In some embodiments, the replica substrate may comprise or consist of a glass, a glass ceramic, a metal or a metal oxide. In some embodiments, the replica substrate may comprise glass or may comprise a non-glass material coated with a glass surface. In some embodiments, the replica substrate consists of glass. In other embodiments, the replica substrate may comprise a metal or a metal oxide.

In some embodiments, the nanopillar-forming material may be any compound that, when heated or allowed to cure or react as a precursor layer, forms a material that will bond to the replica substrate or the replica-substrate surface. In some embodiments, the material formed by the nanopillar-forming material may be the same material as the replica substrate or at least of the replica-substrate surface. In other embodiments, the nanopillar-forming material need not form the same material as the replica substrate, provided the material that is formed by the nanopillar-forming material results in nanopillars that do not readily detach from the replica-substrate surface. In other embodiments, the nanopillar-forming material may be the same material as the replica substrate or replica-substrate surface itself in solid or liquid phase. If the nanopillar-forming surface is in the liquid phase for example, it may be beneficial for the liquid to have a sufficiently high viscosity to prevent the nanopillar-forming material from flowing off the replica-substrate surface before the precursor is contacted to the template surface of the self-assembled polymer layer. If the nanopillar-forming material is in the solid phase for example, it may be beneficial for the nanopillar-forming material to be sufficiently soft to enable the material to be shaped when pressed against the pores in the template surface.

In an illustrative embodiment, if the substrate or substrate surface is a silicate glass, for example, the nanopillar-forming material may be any liquid or solid chemical compound such as a polysiloxane that can react or change physical form to become the silicate glass. In some embodiments, the nanopillar-forming material may include silicon-containing organic compounds such as polysiloxanes or silsesquioxanes. For example, in one embodiment the nanopillar-forming material may include a polydimethylsiloxane (PDMS), which optionally may be combined with a suitable curing agent. In other embodiments, the nanopillar forming material may be a UV-curable polymer or a UV-curable resin such as acrylates, acylamides, epoxies, polyurethanes, esters, or polyimides. For example, in one embodiment, the nanopillar-forming material may include a perfluoroether-acrylate such as perfluoroethertetraacrylate (PFETA), optionally combined with a photoinitiator that enables the PFETA to be cured using UV irradiation. In still other embodiments, the nanopillar forming material may include inorganic compounds such as silicates or sol-gel chemistry precursors. In illustrative embodiments, the replica substrate may be glass and the nanopillar-forming material may be a polydimethylsiloxane or perfluoroethertetraacrylate. In other embodiments, the nanopillar-forming material may include one or more solid-phase or liquid-phase organometallic precursors of a metal, a metal oxide, or a glass. In some embodiments, the nanopillar-forming material may be deposited by a vapor-phase deposition. In other embodiments, the nanopillar-forming material may be deposited by a liquid-phase deposition, such as by spin coating or dip coating, for example.

According to some embodiments, the methods for replicating nanopillared substrate surfaces may further include contacting a template surface of a nanomask to the precursor layer. The nanomask may include a self-assembled polymer layer on a nanomask-substrate surface of a nanomask substrate. The template surface may be defined in the self-assembled polymer layer opposite the nanomask-substrate surface. The self-assembled polymer layer may have defined therein a plurality of pores with openings at the template surface. During the contacting of the template surface to the precursor layer, the nanomask is used as a nanoreplication mask to fabricate nanopillars on the replica-substrate surface. In some embodiments, the template surface may be pressed onto the polymer precursor with an applied pressure sufficient to cause the material of the precursor layer to fill the void regions or pores in the template surface of the nanomask. In some embodiments, the plurality of pores in the template surface may have a mean pore diameter from about 100 nm to about 200 nm.

Characteristics of the self-assembled polymer layer and suitable materials for use as the self-assembled polymer layer are described below in the context of illustrative embodiments for preparing the nanomask and have been described in summary above with reference to FIGS. 4A-4C. Generally, the self-assembled polymer layer of the nanomask includes a template surface with pores that have been formed by removing hydrophilic domains from the self-assembled polymer layer. The hydrophilic domains may have been formed during self-assembly of the self-assembled polymer layer as a result of ordering between an amphiphilic block copolymer and a hydrophilic homopolymer on the nanomask-substrate surface.

Without intent to be bound by theory, it is believed that during self-assembly the amphiphilic block copolymer arranges itself such that hydrophobic ends of individual polymer molecules group together to form hydrophobic domains and such that hydrophilic ends of the individual polymer molecules orient thereby to form hydrophilic domains having greater affinity to the hydrophilic homopolymer. Thus, when the hydrophilic homopolymer is selectively removed with an appropriate etchant such as water or alcohol, for example, the spaces in the self-assembled polymer layer that were formerly occupied by the hydrophilic homopolymer become the plurality of pores. Because the hydrophilic homopolymer may be more energetically favorably located at or near the template surface, the plurality of pores formed by removing the hydrophilic homopolymer may have openings at the template surface itself. In an illustrative embodiment, the plurality of pores in the self-assembled polymer layer may be formed by removing hydrophilic domains from the self-assembled polymer layer and the hydrophilic domains may have resulted from self-assembling a polymer mixture of polystyrene-block-polyethylene oxide (PS-b-PEO) block copolymer and poly (acrylic acid) on the nanomask-substrate surface. In such an embodiment, the self-assembled polymer layer may consist essentially of the PS-b-PEO block copolymer arranged such the hydrophilic polyethylene oxide ends of the block copolymer are concentrated at surfaces of the plurality of pores.

According to some embodiments, the methods for replicating nanopillared substrate surfaces may further include curing the precursor layer while the template surface remains in contact with the precursor layer to form a cured precursor layer between the template surface and the replica-substrate surface. The curing converts the precursor layer into a cured precursor layer that bonds to the replica-substrate surface and may have material characteristics similar to or identical to those of the replica substrate or the replica-substrate surface. For example, in one embodiment, if the replica substrate or the replica-substrate surface is a glass, the cured precursor layer may also be a glass.

In some embodiments, curing the precursor layer may include heating the precursor layer to a curing temperature dependent on the nano-pillar forming material that is used. For example, in one embodiment the nano-pillar forming material is PDMS, and curing the precursor layer of PDMS on the replica-substrate surface may include heating the precursor layer to a curing temperature of about 40° C. to about 80° C., for example about 50° C., for a curing time sufficient to cure the PDMS and allow bonding of the PDMS to the replica-substrate surface. For PDMS, a suitable curing time at 50° C. may be from about 6 hours to about 24 hours, for example, depending on the thickness of the precursor layer.

In other embodiments, curing the precursor layer may include exposing the precursor layer to UV radiation. For example, in some embodiments the nano-pillar forming material may be a UV-curable polymer. Curing of the UV-curable polymer may include exposing the UV-curable polymer to UV radiation of a suitable wavelength and intensity to cure the UV-curable polymer and allow bonding of the UV-curable polymer to the replica-substrate surface. In an exemplary embodiment, the nanopillar-forming material may be PFETA optionally mixed with a photoinitiator, such that exposing the PFETA and photoinitiator to UV radiation causes the PFETA to cure and to bond to the replica-substrate surface. In an illustrative embodiment, suitable conditions for curing a PFETA on a replica-substrate surface such as glass may include exposing the PFETA to UV radiation with an energy of about 1500 mJ/cm$^2$ for 1 minute to 2 hours, for example.

According to some embodiments, the methods for replicating nanopillared substrate surfaces may further include removing the nanomask to expose a nanopillared surface comprising a plurality of nanopillars on the replica-substrate surface. The plurality of nanopillars on the replica-substrate surface may correspond to the plurality of pores in the template surface. Thereby, the pore structure of template surface the nanomask is negatively replicated as a nanopillared surface structure on the replica-substrate surface.

Once the precursor layer is cured, the nanomask may be removed by peeling the replica substrate with the cured precursor layer thereon away from the template surface of the self-assembled polymer layer on the nanomask substrate. The plurality of nanopillars may have heights that vary depending on process parameters used throughout the methods according to embodiments herein. In some embodiments, the plurality of nanopillars may have nanopillar heights ranging from about 50 nm to about 150 nm, for example. In some embodiments, the nanopillared substrate surface may be hydrophobic and may exhibit a water contact angle greater than 110°, for example.

In some embodiments, the nanopillared substrate surface may be subjected to one or more post treatments that may increase properties such as antireflective properties to visible light or hydrophobicity. Increased hydrophobicity of the nanopillared substrate surface may result in increase resistance of the surface to smudging, such as from fingerprints. In some embodiments, the post-treatment may include treating the nanopillared substrate surface with oxygen plasma. Post-treatment in oxygen plasma may increase the uniformity of heights of the nanopillars and increase both antireflective properties and anti-smudge properties of the nanopillared substrate surface. In some embodiments, a post-treatment, particularly applicable to glass substrates, may include coating the nanopillared substrate surface with a fluorosilane compound to increase hydrophobicity of the nanopillared substrate surface.

According to some embodiments, the methods for replicating nanopillared substrate surfaces may include preparing the nanomask used for the replication. Preparing the nanomask may include applying a polymer solution to a nanomask-substrate surface of a nanomask substrate. The nanomask substrate may be any substrate having surfaces that are chemically compatible with the polymer solutions described below, such that when the polymer solution is applied to a surface of the nanomask substrate, components of the polymer solution self-assemble to form hydrophobic domains and hydrophilic domains that can be separately and independently treated or manipulated to form surface structures on the nanomask-substrate surface.

In some embodiments, the nanomask substrate may be selected from materials that can be patterned by the methods embodied herein including, but not limited to, metals, metal oxides, polymers, silica, glass ceramics, ceramics, and glasses. Exemplary glasses include, without limitation, silicate glasses, borosilicate glasses, aluminosilicate glasses, aluminoborosilicate glasses, soda lime glasses, and Gorilla™ Glass (an alkali-metal aluminosilicate glass toughened by ion exchange of potassium for sodium), for example. In some embodiments, the nanomask substrate may comprise or consist of a glass, a glass ceramic, a metal or a metal oxide. In some embodiments, the nanomask substrate may comprise glass or a glass surface. In some embodiments, the nanomask substrate consists of glass. In other embodiments, the nanomask substrate may comprise a metal or a metal oxide.

The polymer solution applied to the nanomask-substrate surface may contain an amphiphilic block copolymer having hydrophobic blocks and hydrophilic blocks, a hydrophilic homopolymer that is chemically compatible with the hydrophilic blocks of the amphiphilic block copolymer, and an application solvent.

The amphiphilic block copolymers according to some embodiments are formed from polymer blocks. The polymer blocks of each amphiphilic block copolymer include hydrophobic blocks and hydrophilic blocks. Thus, the block copolymers embodied herein may comprise hydrophobic sections and hydrophilic sections. The hydrophobic sections comprise hydrophobic moieties such as, but not limited to, poly(alkyl acrylates), poly(alkyl methacrylates), polystyrenes, polyalkylene such as polyethylenes or polypropylenes, or polybutadienes. In some embodiments, the hydrophobic blocks may include polystyrenes. The hydrophilic sections may comprise hydrophilic moieties or oligomers such as, but not limited to, poly(acrylic acid), poly(methacrylic acid), polyisoprenes, polyvinylpyridines, or polyalkylene oxides such as polyethylene oxide. In some embodiments, the hydrophilic section comprises polyethylene oxide. In one illustrative embodiment, the hydrophobic section may comprise polystyrene and the hydrophilic section may comprise polyethylene oxide.

Specific non-limiting examples of amphiphilic block copolymers that can be used for forming self-assembled polymer layers on substrate surfaces include polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), polyvinylpyridine-block-polymethylmethacrylate (PVP-b-PMMA), polystyrene-block-polybutadiene (PS-b-PBD), and polyisoprene-block-polymethylmethacrylate (PI-b-PMMA). In an illustrative embodiment, the amphiphilic block copolymer may comprise a polystyrene-block-polyethyleneoxide (PS-b-PEO) block copolymer having polystyrene hydrophobic blocks and polyethylene oxide hydrophilic blocks.

Exemplary classes of amphiphilic block copolymers suitable for use in embodiments herein include, but are not limited to, linear diblock, triblock, and multiblock copolymers, star copolymers, and graft copolymers. Without intent to be bound by theory, it is believed that in a given block copolymer system, the relative chain lengths of the blocks determine the resulting morphology of a self-assembled polymer layer that may be formed on a nanomask-substrate surface. In some embodiments, the amphiphilic block copolymer may be substantially monodisperse. In particular, in such embodiments the amphiphilic block copolymer may have a polydispersity index of from 1.00 to about 1.20, or from about 1.02 to about 1.15, or from about 1.02 to about 1.10. The polydispersity index of the amphiphilic block copolymer refers to the ratio $M_W/M_N$ of the amphiphilic block copolymer, where $M_W$ is the weight-average molecular weight of the amphiphilic block copolymer and $M_N$ is the number-average molecular weight of the amphiphilic block copolymer.

In some embodiments, the hydrophobic blocks may compose from about 60 wt. % to about to about 98 wt. %, or about 75 wt. % to about 98 wt. % of the amphiphilic block copolymer, based on the total weight of the amphiphilic block copolymer. In some embodiments, the amphiphilic block copolymer may have a number-average molecular weight ($M_N$) of from about 100,000 Dalton to about 500,000 Dalton. Non-limiting illustrative compositions of amphiphilic block copolymers may include, for example, PS-b-PEO block copolymers with $M_N$ of 105,000-b-3,000; 150,000-b-35,000; 225,000-b-26,000; or 384,000-b-8,000. These illustrative compositions may additionally be substantially monodisperse, with polydispersity indices of from about 1.00 to about 1.20, for example.

The polymer solution further includes a hydrophilic homopolymer that is chemically compatible with the hydrophilic blocks of the amphiphilic block copolymer. Chemical compatibility of the hydrophilic homopolymer with the hydrophilic blocks of the amphiphilic block copolymer may result in the formation of hydrophilic domains of the hydrophilic homopolymer in the self-assembled polymer layer because the hydrophilic homopolymer may maintain a chemical affinity to the hydrophilic blocks of the amphiphilic block copolymer and thereby influence the morphology of the self-assembled polymer layer.

In non-limiting illustrative embodiments, the hydrophilic homopolymer may include a poly(acrylic acid), for example. Particularly in embodiments for which the hydrophilic blocks of the amphiphilic block copolymer are polyethylene oxide, a poly(acrylic acid) hydrophilic homopolymer is believed to have a high level of chemical compatibility with the polyethylene oxide, such that hydrophilic domains of the hydrophilic homopolymer readily form in the self-assembled polymer layer.

In some embodiments, the hydrophilic homopolymer may have number-average molecular weights ($M_N$) of from about 2000 Dalton to about 30,000 Dalton. Nevertheless, it is contemplated that the hydrophilic homopolymer may have number-average molecular weights ($M_N$) less than 2000 Dalton or greater than 30,000 Dalton. In some embodiments, the hydrophilic homopolymer may be substantially monodisperse. In particular, in such embodiments the hydrophilic homopolymer may have a polydispersity index of from 1.00 to about 1.20, or from about 1.02 to about 1.15, or from about 1.02 to about 1.10. In non-limiting illustrative embodiments, the hydrophilic homopolymer may include a poly(acrylic acid) having a number-average molecular weight of from about 2000 Dalton to about 30,000 Dalton or from about 5000 Dalton to about 27,000 Dalton, with a polydispersity index of from about 1.05 to about 1.15.

Without intent to be bound by theory, it is believed that the weight ratio of the amphiphilic block copolymer to the hydrophilic homopolymer in the polymer solution may affect one or more of the morphology of the self-assembled polymer layer, the size of pores that may be formed by removing hydrophilic domains, or the area fraction of pores on the template surface of the self-assembled polymer layer. In some embodiments, the weight ratio of the amphiphilic block copolymer to the hydrophilic homopolymer in the polymer solution is from about 1:1 to about 10:1, for example from about 1.5:1 to about 10:1, from about 2:1 to about 9:1, or from about 2:1 to about 5:1, or from about 2:1 to about 4:1. In some embodiments, increasing the ratio of the amphiphilic block copolymer to the hydrophilic homopolymer in the polymer solution may result in formation of hydrophilic domains that are smaller and represent a smaller area fraction of the template surface of the self-assembled polymer layer.

The polymer solution may further include an application solvent. In some embodiments, the application solvent may be any solvent that at least partially dissolves both the amphiphilic block copolymer and the hydrophilic homopolymer. In some embodiments, the application solvent may be any solvent used in a sufficient amount so as to completely dissolve both the amphiphilic block copolymer and the hydrophilic homopolymer into the polymer solution. It is believed that the level of dissolution of the amphiphilic block copolymer and the hydrophilic homopolymer may relate to the evenness in thickness of the application of the polymer solution, particularly when deposition techniques such as spin coating or dip coating may be used. Exemplary application solvents in embodiments herein may include, without limitation, organic solvents such as toluene, tetrahydrofuran, propylene glycol monomethyl ether acetate (PGMEA), propylene glycol monomethyl ether (PGME), acetone, or benzene. In an illustrative embodiment, the application solvent may comprise or consist of tetrahydrofuran.

In some embodiments, the amount of application solvent as a weight percent of the polymer solution may depend on the molecular weights of the polymers. In some embodiments, the polymer solution may contain from about 0.02 wt. % to about 4 wt. % total polymer (amphiphilic block copolymer and hydrophilic homopolymer), based on the total weight of the polymer solution, with the remaining 96 wt. % to 99.98 wt. % being application solvent.

In exemplary embodiments, the polymer solution may be applied to the nanomask-substrate surface by any suitable method for coating substrates with polymer solutions. For example, the polymer solution may be applied to the nanomask-substrate surface by spin coating or dip coating. In other embodiments, the polymer solution may be applied by spray coating, roll coating, or by a printing process such as screen printing. In some embodiments, the polymer solution may be prepared in advance of its application, for example, by mixing the amphiphilic block copolymer, the hydrophilic homopolymer, and the application solvent together to form a mixture, such that the mixture is applied to the nanomask-substrate surface. In other embodiments, the amphiphilic block copolymer and the hydrophilic homopolymer may be separately dissolved in one or more application solvents to form two separate solutions. Then, each of the separate solutions may be applied to the nanomask-substrate surface in any order by any suitable technique, including but not limited to those described above.

The amphiphilic block copolymer and the hydrophilic homopolymer in the polymer solution may be allowed to self-assemble on the nanomask-substrate surface to form a self-assembled polymer layer. In some embodiments, the self-assembly occurs without assistance as the application solvent is removed by evaporation, with or without gentle heating. The combination of the amphiphilic block copolymer and the hydrophilic homopolymer creates a two-component polymeric structure on the nanomask substrate. In some embodiments, the two-component polymeric structure comprises a continuous phase of one component and a dispersed phase of the other component. In some embodiments, the dispersed phase comprises one or more three-dimensional structures such as columnar structures comprising either the block copolymer or the homopolymer. In some embodiments, the dispersed phase may comprise one or more homogeneous polymers and the continuous phase may comprise a block copolymer. In other embodiments, the dispersed phase may comprise one or more block copolymers and the continuous phase may comprise a homopolymer. In some embodiments, the dispersed phase may comprise hydrophobic domains of block copolymers wherein the hydrophilic groups are concentrated in hydrophilic domains adjacent to the hydrophobic domains, such that hydrophilic ends of the block copolymer line up to face the hydrophilic domains. In some embodiments, the one or more hydrophilic domains are concentrated at the surface of the film formed by the polymeric structure. In some embodiments, one or more hydrophilic domains are concentrated at the nanomask-substrate surface.

In some embodiments, the two phases are immiscible. In some embodiments, the two phases form an emulsion. In some embodiments, the emulsion is an unstable emulsion. In some embodiments, the unstable emulsion results in the dispersed phase concentrating at the surface of the film formed by the polymeric structure. In some embodiments, the unstable emulsion results in the dispersed phase concentrating on the nanomask substrate.

The domain sizes of the hydrophilic domains formed in the dispersed phase may vary from about 50 nm to about 400 nm or from about 100 nm to about 300 nm or from about 100 nm to about 250 nm. In some embodiments, the hydrophilic domains may have an average diameter of from about 120 nm to about 250 nm. The hydrophilic domains may be evenly dispersed in the continuous phase or may be concentrated at the template surface of the self-assembled polymer layer or on or near the nanomask-substrate surface. In some embodiments, the hydrophilic domains may be concentrated at the template surface of the self-assembled polymer layers and may represent an area fraction of the template surface of the self-assembled polymer layer. In some embodiments, the self-assembled polymer layer may include hydrophobic domains adjacent to the nanomask-substrate surface and hydrophilic domains extending into the self-assembled polymer layer from a template surface of the self-assembled polymer layer opposite the nanomask-substrate surface. The area fraction may describe the fraction of the template surface having an area consisting of hydrophilic domains, based on the total surface area of the template surface. In illustrative embodiments, the template surface of the self-assembled polymer layer may have an area fraction of hydrophilic domains of from about 5% to about 60%, or from about 10% to about 50%, or from about 10% to about 40%, or from about 20% to about 40%, or from about 20% to about 30%.

Preparing the nanomask may further include removing at least a portion of the hydrophilic domains to form a plurality of pores in the template surface of the self-assembled polymer layer. In some embodiments, the hydrophilic domains that are removed to form the plurality of pores may be concentrated at or near the template surface of the self-assembled polymer layer. In some embodiments, the hydrophilic domains may be removed by physical techniques such as reactive-ion etching. In other embodiment, the hydrophilic domains may be removed by wet chemical techniques such as selective etching or washing in a polar solvent such as water or alcohols such as methanol, ethanol, propanol, or isopropanol. In illustrative embodiments, the hydrophilic domains may be removed by selectively etching the self-assembled polymer layer in water or ethanol for an etching period of from 2 minutes to 10 minutes, for example.

Selective chemistry may also be used to chemically modify one or more block copolymer components to alter their etching rate. Various means to selectively, chemically modify one or more block copolymers are known. For example, the polyisoprene (PI) or polybutadiene (PB) component of a PI-PS or PB-PS may be selectively modified with vapors of osmium tetroxide, an aggressive staining agent that deposits osmium tetroxide on the diene carbon-carbon double bonds. This heavy metal reduces the etch rate of the diene component in a 10:1 $CF_4:O_2$ plasma. Thereby, the PS etches twice as fast as the PB or PI component and the pattern is transferred to the nanomask substrate. Thus, in some embodiments, it is contemplated that selective etching chemistries may be used to selectively remove one or more of the hydrophilic domains, the hydrophilic blocks of the amphiphilic block copolymer, the hydrophobic blocks of the amphiphilic block copolymer, or any hydrophobic domains of the self-assembled polymer layer.

In some embodiments, the plurality of pores may vary in size or diameter, in density (porosity), in depth, or in distance between pores, based on the choices of one or more of the amphiphilic block copolymer, the hydrophilic homopolymer, the application solvent, or the etchant used to remove the hydrophilic domains of the self-assembled polymer layer. For example, in some embodiments, the plurality of pores may be formed to have pore sizes of from about 50 nm to about 500 nm, pore depths of from about 50 nm to about 200 nm, and distances between pores of from about 50 nm to about 500 nm. In some embodiments, the plurality of pores in the template surface have a mean pore diameter from about 100 nm to about 200 nm. In some embodiments, the plurality of pores in the template surface define a surface area fraction of pores in the template surface of less than 50%, for example from about 10% to about 40%, from about 15% to about 35%, or from about 20% to about 35%. Once the plurality of pores is formed, the self-assembled polymer layer may have a porosity of from about 5% to about 50%, for example. In some embodiments, the hydrophilic domains may have a substantially cylindrical morphology in the self-assembled polymer layer, such that the plurality of pore formed by removing the hydrophilic domains may also be substantially cylindrical and oriented normal or nearly normal to the nanomask-substrate surface.

Thus, embodiments of methods for replicating nanopillared surfaces have been described. The methods according to various embodiments use a self-assembled polymer layer as a nanomask for forming nanopillar structures on the substrate surface. The methods embodied herein use minimal materials, are fast with high throughput, and have low processing costs. In some embodiments herein, for which a nanopillared substrate surface may be formed on a glass substrate, high quality, uniform, defect-free nanopillared surfaces may be formed over a large area, such as may be necessary for coating large window panes or large-area television screens. Additionally, as described herein, the surface density and diameter of nanopillars may be optimized for achieving anti-wetting, anti-smudge, anti-reflection, and optical scattering characteristics, any of which may be desirable for various commercial applications.

EXAMPLES

The embodiments described herein will be further clarified by the following examples.

Example 1

Polymer Materials

The polymer materials used in the nanomask fabrication process are listed in TABLE 1. These materials are purchased from polymer source, incorporation, Montreal, Canada. The abbreviation PS-b-PEO refers to a block copolymer of polystyrene and polyethylene oxide. The abbreviation PAA refers to poly(acrylic acid). All polymers were formed by living anionic polymerization. The number-average molecular weights for the PS-b-PEO block copolymers are provided in the form "X-b-Y," where X refers to the contribution of polystyrene blocks to the molecular weights, Y refers to the contribution of polyethylene oxide blocks to the molecular weights, and X+Y refers to the total number-average molecular weight. For example, a number-average molecular weight of 105-b-3 refers to a PS-b-PEO block copolymer having a total number-average molecular weight of 108,000 Dalton, to which 105,000 Dalton is contributed by polystyrene blocks and 3,000 Dalton is contributed by polyethylene oxide blocks.

TABLE 1

| Compound Identifier | Polymer Type | Number-Average Molecular Weight $M_N/10^3$ | Polydispersity Index $(M_W/M_N)$ |
|---|---|---|---|
| A1 | PS-b-PEO that | 105-b-3 | 1.07 |
| A2 | PS-b-PEO that | 150-b-35 | 1.09 |
| A3 | PS-b-PEO that | 225-b-26 | 1.12 |
| A4 | PS-b-PEO that | 384-b-8 | 1.15 |
| B1 | PAA | 5.7 | 1.09 |
| B2 | PAA | 8.0 | 1.07 |
| B3 | PAA | 14 | 1.08 |
| B4 | PAA | 26.5 | 1.12 |

Example 2

Polymer Solution

A polymer solution is prepared by mixing PS-b-PEO with PAA and dissolving the polymers in THF solution. Optionally, the samples may be heated to 60° C. to dissolve the polymer. The total polymer concentration is about 0.02 wt. % to about 4% wt. %, depending on the molecular weight of polymer and the desired film thickness. The polymer solution may then be filtered with a 0.2-μm syringe filter to be ready for deposition onto a glass surface.

Example 3

Polymer Film

A 2-inch by 2-inch (5.08 cm×5.08 cm) glass substrate is washed with acetone and isopropyl alcohol before applying the polymer solution prepared in Example 2. The glass surface does not require any pretreatment for this quick self-assembling and oriented film process. The polymer nanomask film is prepared at a specific room temperature (25° C.±3° C.) by spin coating process at 1000 rpm to 3000 rpm with an acceleration of 200 rpm/s to 1000 rpm/s for a total time of about 40 seconds. Alternatively, dip coating may be used.

Example 4

Polymer Nanomask Formation

Once the polymer film is applied, the polymer solution self-assembles to form a surface with cylindrical hydrophilic domains of the poly(acrylic acid). The polymer nanomask may be fabricated by selectively etching the cylindrical morphology of the polymer film with a polar solvent such as water or ethanol for 2 minutes to 10 minutes, for example, and subsequently drying the polymer film by forced airflow, for example.

In an exemplary system, polystyrene-block-polyethylene oxide PS-b-PEO is used as the amphiphilic block copolymer and poly(acrylic acid) (PAA) is used as the hydrophilic monomer. The amphiphilic block copolymer PS-b-PEO contains series of two types of blocks: hydrophobic polystyrene blocks and hydrophilic polyethylene oxide blocks. The polyacrylic acid is both hydrophilic and water soluble. After mixing the PS-b-PEO and PAA together in THF as an application solvent to form a polymer solution, the polymer solution may be spin-coated or dip-coated to form a thin polymer film after removal of the application solvent. During the solvent removal process, the polymer system may phase separate into a hydrophobic PS domain and hydrophilic PAA domains; while the PEO domain remains sandwiched between the PS and the PAA to increase the miscibility of these two incompatible sections. Because PAA is water soluble, the PAA can be easily dissolved away PAA domain by water or ethanol soaking. Once the PAA is removed, a porous polymer nanomask remains.

Nanomask samples were made by spin-coating from 2 wt. % weight solution of Compounds A2 and B1 in THF at mixing weight ratio of 7 parts Compound A2 to 3 parts Compound B1. Immediately after spin-coating and phase separation, PAA formed a circular domain with slightly indented shallow structures around 40 nm. Hydrophilic domain sizes ranged from 50 nm to 300 nm, with a mean pore size of 160 nm. The cylindrical domain area fraction was 30.8%, which was close to the weight ratio of PAA in the polymer solution. After etching away PAA by ethanol soaking, cylindrical holes with greater depths (about 90 nm) were formed, and the domain sizes ranged from 50 nm to 350 nm. The mean pore size after etching increased to 214 nm.

Figure 5A:
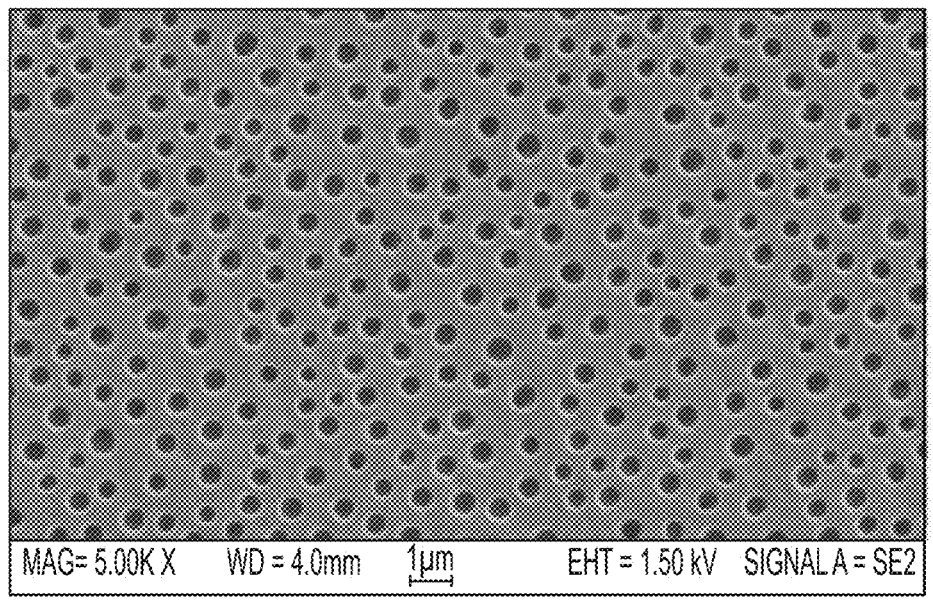
FIG. 5A is a scanning-electron micrograph of an exposed surface of a self-assembled polymer layer, prepared according to embodiments described herein, after hydrophilic domains are removed from the self-assembled polymer layer.
Figure 5B:
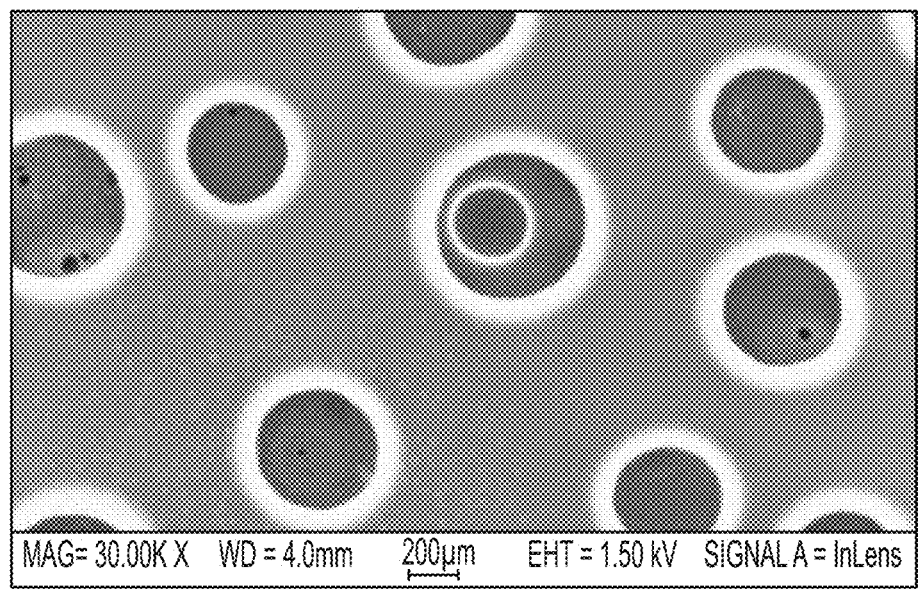
FIG. 5B is a scanning-electron micrograph of the exposed surface of FIG. 5A at a higher magnification.

FIGS. 5A and 5B are Scanning Electron Microscopy (SEM) images of the polymer mask after PAA removal. The samples depicted in these images were made by spin-coating a 2 wt. % polymer solution of Compounds A4 and B3 in THF at mixing weight ratio of 7 parts Compound A4 to 3 parts Compound B3. From the SEM image, it is apparent that cylindrical hole domains were distributed uniformly with no defects. It was noted that the cylindrical domains did not span through the exposed top surface of the self-assembled polymer layer to the bottom glass surface and that other layered structures were present beneath the top layer cylindrical holes.

Nanomask geometry may be tailored to achieve desired anti-reflection and anti-smudge properties. Even so, it has been demonstrated that the nanomask techniques can be tailored through controlling the pore sizes and pore area fractions by controlling polymer mixing ratios and polymer molecular weights.

For example, TABLE 2 shows the impact of the mixing ratio of the amphiphilic block polymer and the hydrophilic homopolymer. The samples noted in TABLE 2 each were made by spin-coating 2 wt. % polymer solutions of Compounds A2 (PS-b-PEO with $M_N$ 150,000-b-35,000) and B1 (PAA with $M_N$ 5,700) in THF at four different mixing weight ratios, namely, 9:1, 8:2, 7:3, and 6:4. It was observed that, as the PAA composition fraction increased from 10% to 40%, the mean pore diameter increased from 141 nm to 277 nm and the PAA domain area fraction increased from 12.8% to 39.8%.

TABLE 2

| Weight Ratio PS-b-PEO:PAA | Area Fraction | Mean Pore Diameter (nm) |
| --- | --- | --- |
| 9:1 | 12.8% | 141 |
| 8:2 | 21.5% | 202 |
| 7:3 | 32.1% | 227 |
| 6:4 | 39.8% | 277 |

The impact of molecular weight of the hydrophilic homopolymer is evident from the data of TABLE 3. The amphiphilic block polymer was Compound A4 (PS-b-PEO with $M_N$ 375,000-b-8,000) and the hydrophilic homopolymers were Compound B1 (PAA with $M_N$ of 5,700) and Compound B3 (PAA with $M_N$ of 14,000). The samples were made from 2 wt. % polymer solutions in THF solution with a mixing ratio block polymer to homopolymer of 7:3. The data show that when the homopolymer PAA molecular weight decreased from 14,000 to 5,700, the mean pore size decreased from 495 nm to 241 nm, while the area fractions remained similar.

TABLE 3

| $M_N$ of PAA | Area Fraction | Mean Pore Diameter (nm) |
| --- | --- | --- |
| 14,000 | 25.2% | 495 |
| 5,700 | 24.7% | 241 |

Example 5

Polymer Nanomask as a Replica Molding Mask

Polymer nanomasks fabricated as described above were used as replica molding masks for producing nanopillar structures on glass surfaces. Nanopillar structures were formed using a pillar-forming material selected from polydimethylsiloxane (PDMS) or perfluoroetheracrylate (PFETA). General process steps for replicating nanopillars onto a replica-substrate surface are described above with reference to the schematic illustrations of FIGS. 1A-1C (replication of nanopillars on a single side of a substrate) and 3A-3C (replication of nanopillars on two opposing sides of a substrate).

To form nanopillars using PDMS replication, 30 g of PDMS prepolymer and 3 g of a curing agent (RTV615, a clear liquid silicone rubber, available from GE Silicones) is thoroughly mixed in the weight ratio of 10:1 and is degassed in vacuum to remove air bubbles. Then, a 0.5 g portion of the PDMS prepolymer mixture is poured onto a 2-inch by 2-inch (5.08 cm×5.08 cm) Corning 2318 glass surface in preparation for transferring the nanomask pattern. A polymer nanomask prepared as described in Example 4 above, with glass substrate as a backplate, is applied onto the prepolymer, and the prepolymer is cured in a 50° C. oven for 12 hour. After the curing, the polymer nanomask is peeled off from the crosslinked PDMS.

To form PDMS pillars on both sides of the Corning 2318 glass, the Corning 2318 glass may be sandwiched between two polymer nanomasks, such that spaces between the Corning 2318 and the nanomasks are filled with PDMS prepolymer. Thereby, after thermal curing and removal of the polymer nanomasks, nanopillars of PDMS pillars are present on both sides of the Corning 2318 glass.

To form nanopillars using PFETA replication, perfluoroether tetraacrylate ($M_W$=2600, available from Clariant) and 1 wt. % photoinitiator (Darocur® D1173, 2-hydroxy-2-methyl-1-phenylpropan-1-one, available from Ciba Specialty Chemicals) are thoroughly mixed. Then a 0.5 g portion of the PFETA precursor mixture is applied onto a 2-inch by 2-inch (5.08 cm×5.08 cm) Corning 2318 glass surface in preparation for transferring the nanomask pattern. A polymer nanomask prepared as described in Example 4 above, with glass substrate as a backplate, is applied onto the precursor and the precursor is exposed to UV radiation from a xenon pulsing UV lamp with a power of 1522 mJ/cm². The polymer is further UV cured with a UV fusion belt at a power of 1522 mJ/cm². The UV curing is conducted under nitrogen purging. When the curing is complete, the polymer nanomask is peeled off from the crosslinked PFETA.

To form PFETA pillars on both sides of the Corning 2318 glass, the Corning 2318 glass may be sandwiched between two polymer nanomasks, such that spaces between the Corning 2318 and the nanomasks are filled with perfluoroetheracylate precursor. After UV curing and removal of the polymer nanomasks, PFETA are present on both sides of the Corning 2318 glass.

Figure 6A:
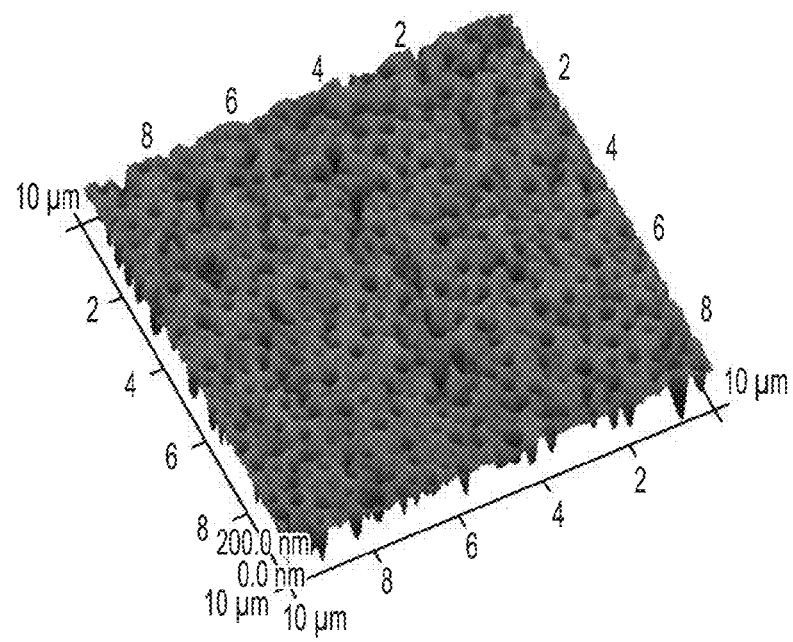
FIG. 6A is an atomic-force micrograph of a polymer nanomask used or prepared according to embodiments of the methods described herein.
Figure 6B:
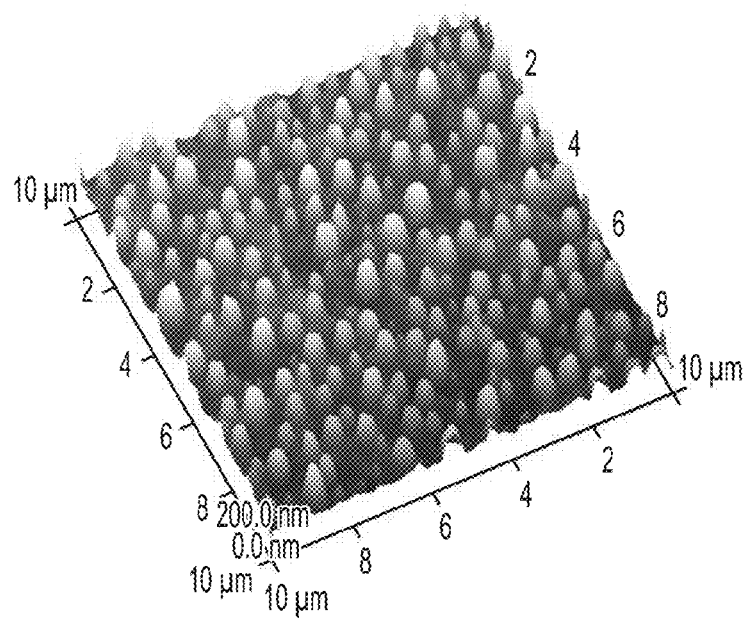
FIG. 6B is an atomic-force micrograph of a nanopillared glass surface formed according to embodiments of the methods described herein using the polymer nanomask of FIG. 6A.

FIG. 6A is a three-dimensional AFM image of a polymer nanomask used to form the nanopillared surface of PDMS nanopillars shown in FIG. 6B. The polymer nanomask composition depicted in FIG. 6A was formed from a polymer solution of 70 wt. % Compound A2 (PS-b-PEO with $M_N$ of 150,000-b-35,000) and 30 wt. % Compound B1 (PAA with $M_N$ of 5,700). The AFM image of FIG. 6B indicates the formation of moth-eye like PDMS nanopillar structures, which are faithfully replicated from the corresponding polymer nanomask of FIG. 6A.

Figure 7A:
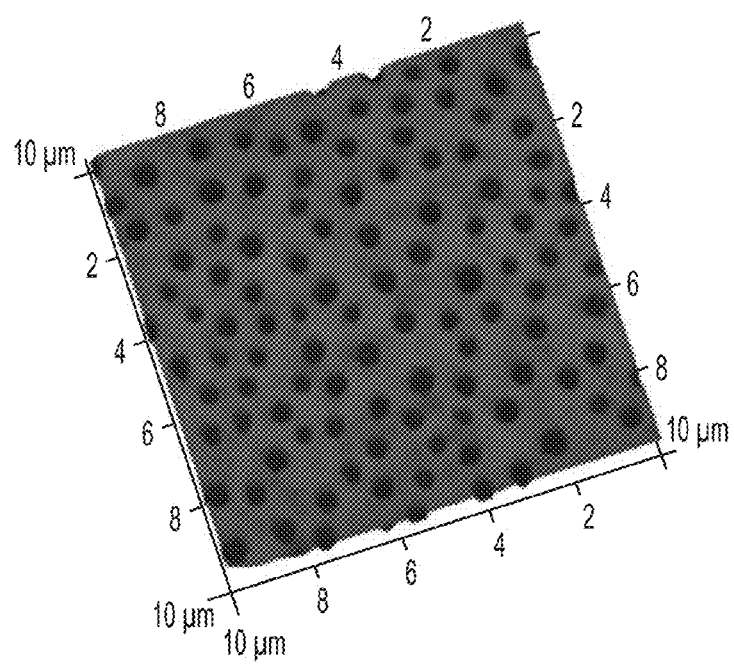
FIG. 7A is an atomic-force micrograph of a polymer nanomask used or prepared according to embodiments of the methods described herein.
Figure 7B:
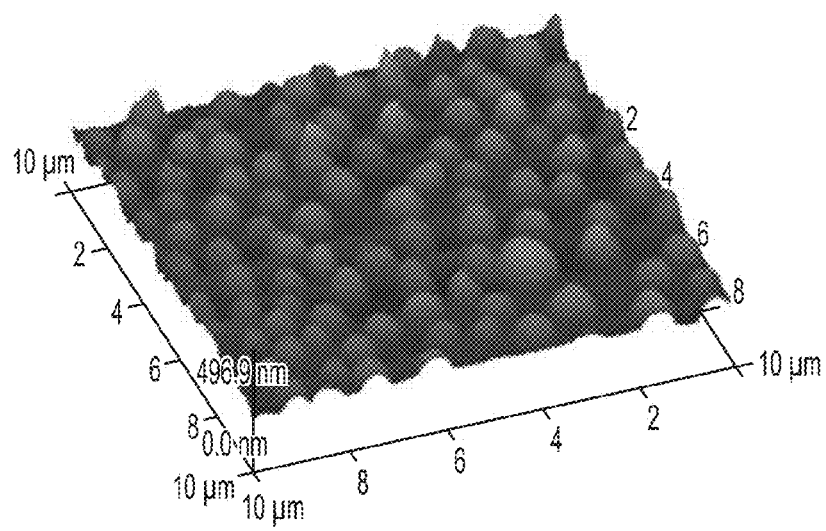
FIG. 7B is an atomic-force micrograph of a nanopillared glass surface formed according to embodiments of the methods described herein using the polymer nanomask of FIG. 7A.
Figure 8A:
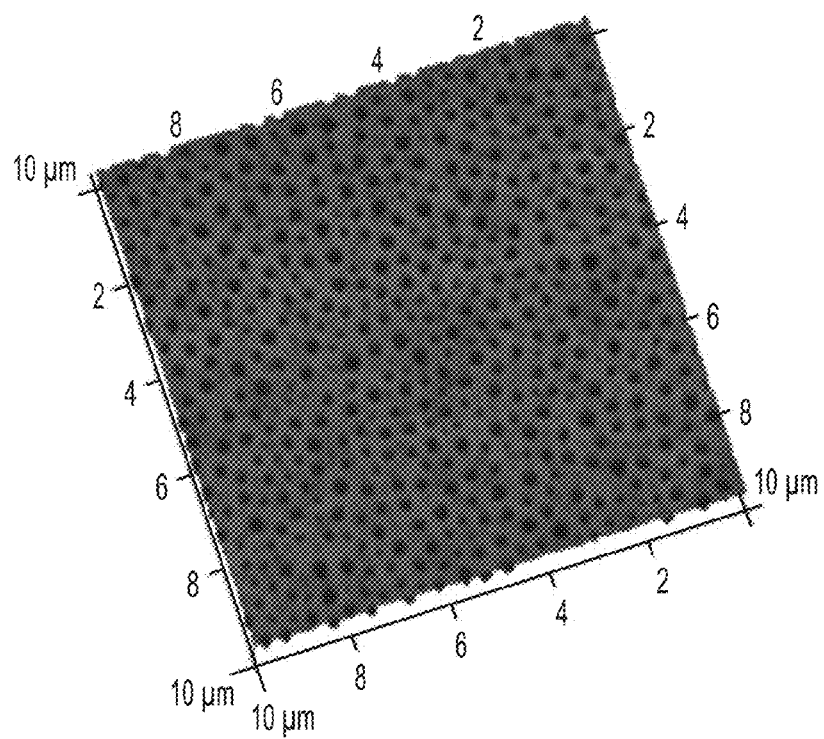
FIG. 8A is an atomic-force micrograph of a polymer nanomask used or prepared according to embodiments of the methods described herein.
Figure 8B:
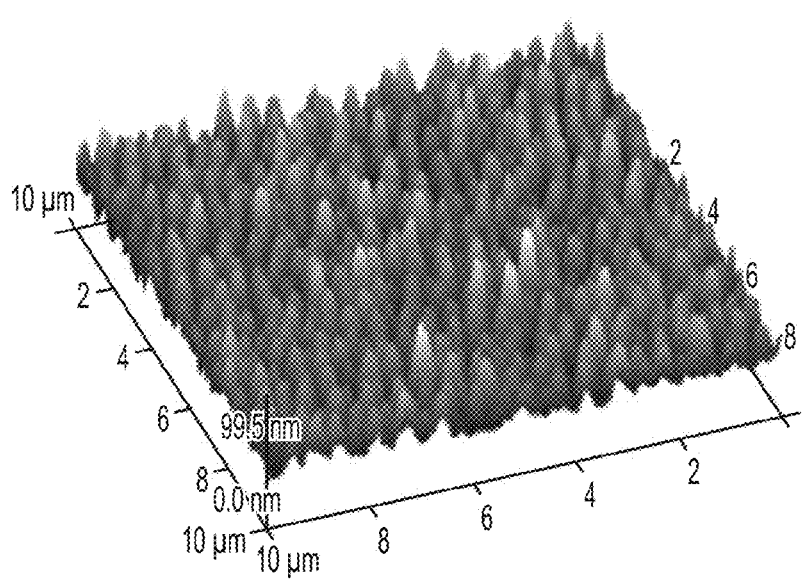
FIG. 8B is an atomic-force micrograph of a nanopillared glass surface formed according to embodiments of the methods described herein using the polymer nanomask of FIG. 8A.

FIGS. 7A and 8A are three-dimensional AFM images of polymer nanomasks used to form the nanopillared surfaces of PFETA nanopillars shown in FIGS. 7B and 8B, respectively. The polymer nanomasks of FIGS. 7A and 8A included self-assembled polymer layers with different pore sizes that resulted from varying the molecular weight of the hydrophilic homopolymer used to form the self-assembled polymer layers. The polymer nanomask with the larger pores evident in FIG. 7A were formed from a polymer solution of 70 wt. % Compound A4 (PS-b-PEO with $M_N$ of 384,000-b-8,000) and 30 wt. % Compound B3 (PAA with $M_N$ of 14,000). The polymer nanomask with the smaller pores evident in FIG. 7B were formed from a polymer solution of 70 wt. % Compound A4 and 30 wt. % Compound Compound B1 (PAA with $M_N$ of 5,700). Again the polymer nanomask is faithfully replicated into PFETA pillars. Likewise, when PAA with a larger molecular weight, a nanomask with larger pores is formed and the corresponding PFETA nanopillars replicating the pores have larger diameter than those formed using a nanomask with smaller pores.

FIG. 2B is an SEM image of PFETA nanopillar arrays replicated from porous polymer nanomask. The porous polymer nanomask was formed from a polymer solution of 70 wt. % Compound A4 (PS-b-PEO with $M_N$ of 384,000-b-8,000) and 30 wt. % Compound B3 (PAA with $M_N$ of 14,000). The SEM of FIG. 2B confirms the fidelity of the replication of the pore structure of the nanomask to the nanopillared surface on the replica substrate.

For all the replication experiments performed, after the polymer nanomask is peeled off, visual inspection shows no sign of mask deterioration and the mask is ready to be reused for additional replications.

Example 6

Anti-Reflection and Anti-Smudge Properties

Reflectivity spectra were acquired using a commercially available thin film surface spectral measurement tool (F10-RT, Filmetrics, USA) to compare control samples with test samples including either PDMS nanopillars or PFETA nanopillars. For anti-smudge characterizations, water contact angle was measured on a Kruss DSA30 goniometer. In each sample, the replica substrate was glass.

Figure 9:
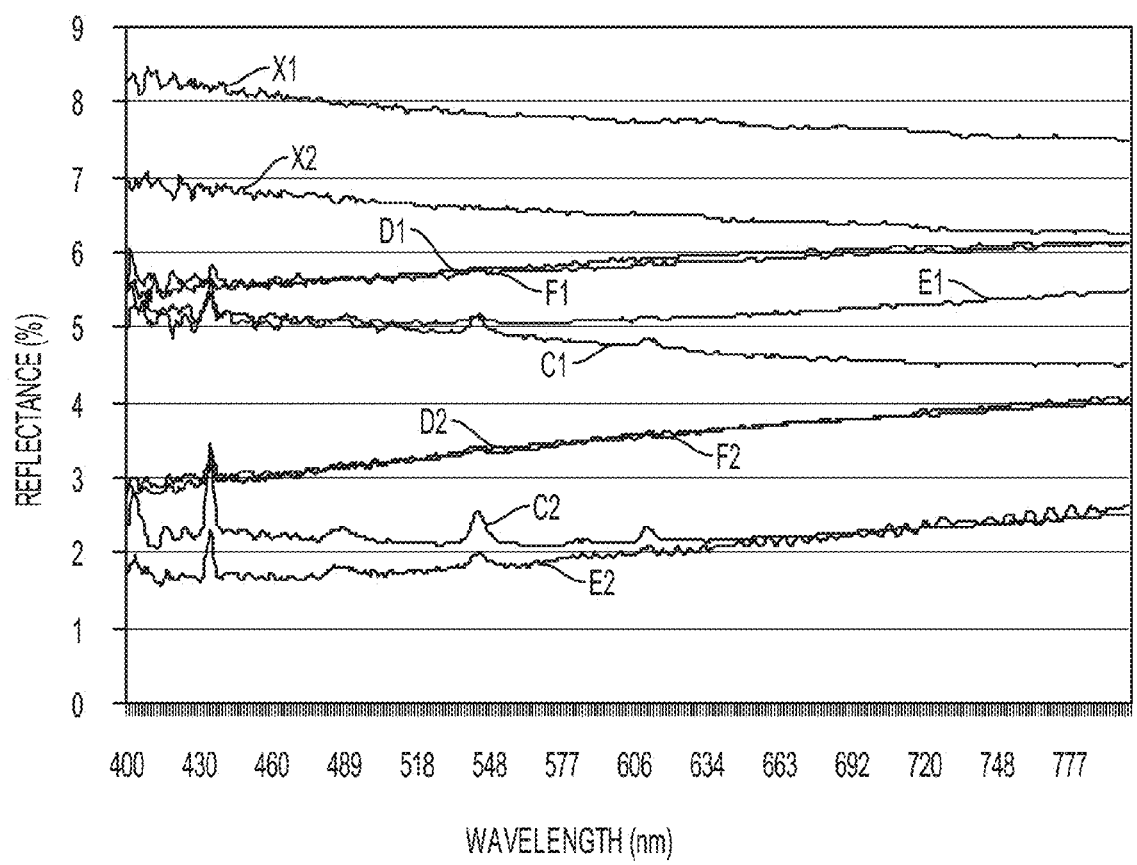
FIG. 9 is a graph of reflectance values of various polydimethylsiloxane (PDMS) nanopillars replicated onto glass surfaces according to embodiments of the methods described herein as functions of wavelength of incident light replicated onto glass surfaces as functions of wavelength of incident light.
Figure 10:
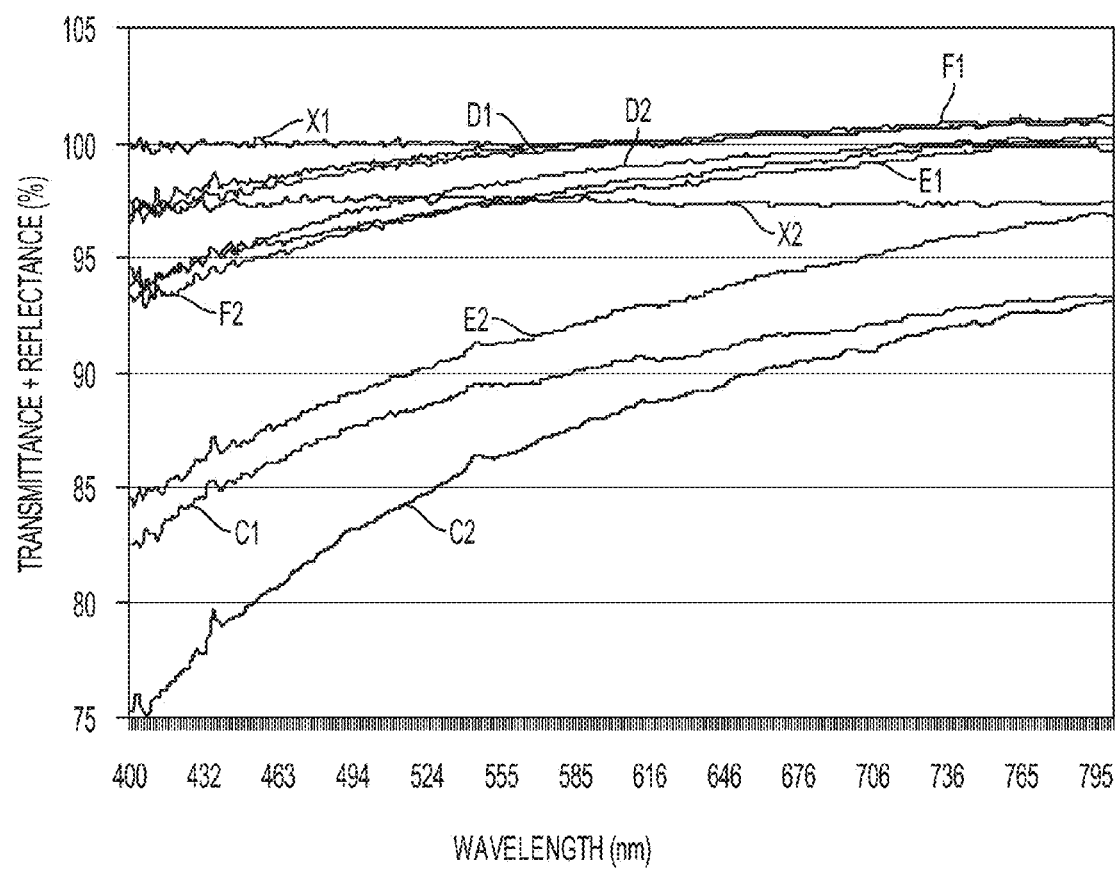
FIG. 10 is a graph of total reflectance plus transmittance of the polydimethylsiloxane (PDMS) nanopillars.

Reflectance values of control samples and of samples having PDMS nanopillared surfaces produced by the replica molding procedures described above are provided in FIG. 9 as functions of wavelength of incident light, particularly of incident light in the visible spectrum. Total reflectance/transmission spectra of the same samples are provided in FIG. 10. In the total reflectance/transmission spectra, values of less than 100% represent loss of light due to scattering phenomena or to absorption of light by impurities in the substrate or the nanopillar array. The data in FIGS. 9 and 10 are provided with reference numbers relating to the samples listed in TABLE 4. Components of the nanomask polymer solution in TABLE 4 refer to the identifiers in TABLE 1 above.

TABLE 4

| Sample | Substrate Description | Nanomask Polymer Solution | | |
|---|---|---|---|---|
| | | PS-b-PEO | PAA | Weight Ratio of PS-b-PEO to PAA |
| C1 | One side PDMS nanopillared | A4 | B3 | 80/20 |
| C2 | Both sides PDMS nanopillared | A4 | B3 | 80/20 |
| D1 | One side PDMS nanopillared | A4 | B1 | 80/20 |
| D2 | Both sides PDMS nanopillared | A4 | B1 | 80/20 |
| E1 | One side PDMS nanopillared | A2 | B1 | 70/30 |
| E2 | Both sides PDMS nanopillared | A2 | B1 | 70/30 |
| F1 | One side PDMS nanopillared | A2 | B1 | 80/20 |
| F2 | Both sides PDMS nanopillared | A2 | B1 | 80/20 |
| X1 (comparative) | Bare flat 2318 glass | N/A | N/A | N/A |
| X2 (comparative) | PDMS coated flat 2318 glass | N/A | N/A | N/A |

Corning 2318 (Gorilla™ Glass) was used as the replica substrate in each sample listed in FIGS. 9 and 10. In the reflectance spectra of FIG. 9, the control sample of bare Corning 2318 glass (X1) had about 8% total reflectance from two sides, which was reduced slightly to about 7% by coating the Corning 2318 glass with a flat thin layer of PDMS (X2). For Corning 2318 glass with various PDMS nanopillars only on a single side (C1, D1, E1, F1), the reflectance was reduced to about 4.5% to about 6%. When nanopillars were added to the Corning 2318 glass on both sides (C2, D2, E2, F2), the reflectance was further reduced to as low as about 1.6%. The total reflectance/transmission spectra of FIG. 10 are not consistent with significant adsorption from PDMS. A few samples with large pillar structures did show some scattering effects. In samples with the smallest pillar diameters (for example, samples F1 and F2, made from nanomasks prepared from a polymer solution of 80 wt. % PS-b-PEO with $M_N$ of 150,000-b-35,000 and 20 wt. % PAA with $M_N$ of 5,700), loss due to scattering was comparatively lower.

Reflectance values of control samples and of samples having PFETA nanopillared surfaces produced by the replica molding procedures described above are provided in FIG. 11 as functions of wavelength of incident light, particularly of incident light in the visible spectrum. Total reflectance/transmission spectra of the same samples are provided in FIG. 12. The data in FIGS. 9 and 10 are provided with reference numbers relating to the samples listed in TABLE 5:

TABLE 5

|  |  | Nanomask Polymer Solution | | |
|---|---|---|---|---|
| Sample | Substrate Description | PS-b-PEO | PAA | Weight Ratio of PS-b-PEO to PAA |
| G1 | One side PFETA nanopillared | A2 | B1 | 80/20 |
| H1 | One side PFETA nanopillared | A4 | B1 | 80/20 |
| J1 | One side PFETA nanopillared | A4 | B3 | 80/20 |
| X1 (comparative) | Bare flat 2318 glass | N/A | N/A | N/A |
| X3 (comparative) | DNP coated flat 2318 | N/A | N/A | N/A |
| X4 (comparative) | PFETA coated flat 2318 | N/A | N/A | N/A |

Figure 11:
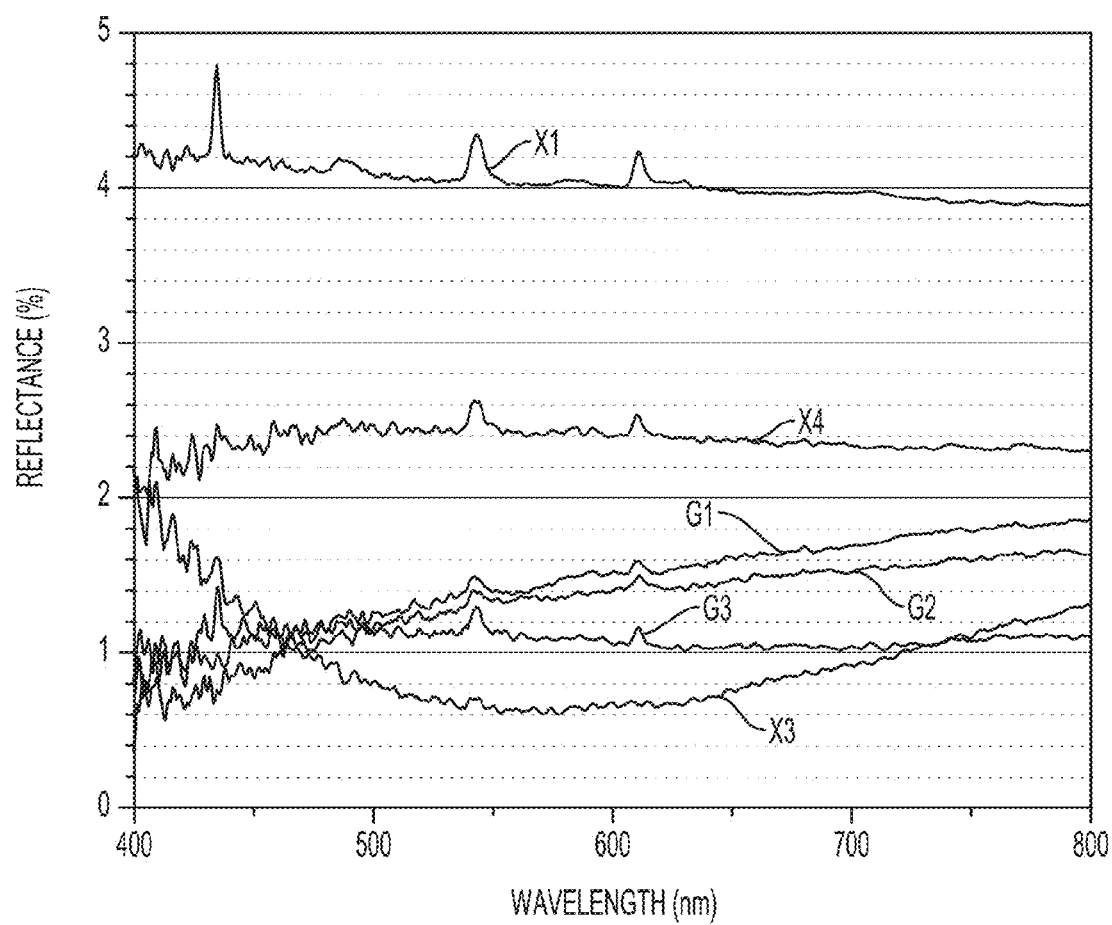
FIG. 11 is a graph of reflectance values of various perfluoroethertetraacrylate (PFETA) nanopillars replicated onto glass surfaces according to embodiments of the methods described herein as functions of wavelength of incident light.
Figure 12:
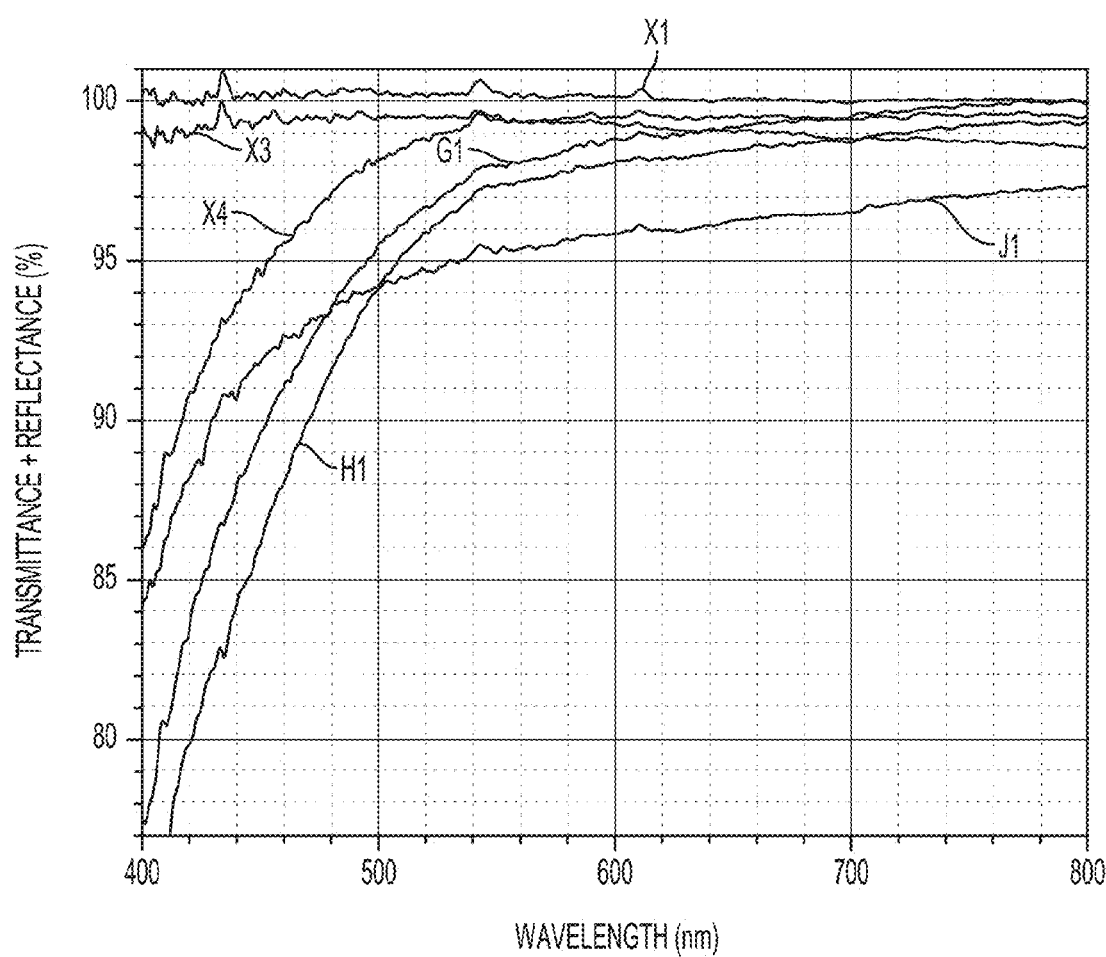
FIG. 12 is a graph of total reflectance plus transmittance of the perfluoroethertetraacrylate (PFETA) nanopillars replicated onto glass surfaces as functions of wavelength of incident light.

Corning 2318 (Gorilla™ Glass) was used as the replica substrate in each sample listed in FIGS. 11 and 12. For the reflectance spectra of FIG. 11, the spectra are processed to present the reflectance of the nanopillar surfaces only. In the reflectance spectra, the control sample of bare Corning 2318 glass (X1) exhibited less than 4% reflectance, which was reduced to about 2% to 2.5% after coating the Corning 2318 glass with a flat thin layer of PFETA (X4). It is believed this reduction of reflectance is due to the low refractive index of PFETA. For Corning 2318 glass with various PFETA nanopillar coatings (G1, H1, and J1), the reflectance was further reduced to about 0.6% to about 1.8%. The reduction of reflectance by the PFETA nanopillars is believed to be related to the moth-eye effect from the nanopillar structures. As a comparative example (X3), a commercial DNP anti-reflective coating used on screens for televisions by Sony, the reflectance was below 2%. The total reflectance/transmission spectra of FIG. 12 show that the PFETA composition used to form the nanopillars may contains impurities that have strong adsorption at shorter wavelength. In samples with the largest nanopillars, scattering effects were prominent.

To assess hydrophobicity and anti-smudge characteristics, water contact angle was measured on the nanopillared surface having PFETA nanopillars. Because PFETA has an intrinsically low surface energy, no additional chemistry modification is needed to measure the water contact angles. The control sample was flat glass coated with PFETA. The control sample had a static water contact angle of about 106.2°. The water contact angle was found to increase to about 118.4° for a nanopillared surface of PFETA nanopillars formed from a large-pore nanomask formed from a polymer solution of 70 wt. % Compound A4 (PS-b-PEO with $M_N$ of 384,000-b-8,000) and 30 wt. % Compound B3 (PAA with $M_N$ of 14,000). For a nanopillared surface of PFETA nanopillars formed from a small-pore nanomask formed from a polymer solution of 70 wt. % Compound A4 (PS-b-PEO with $M_N$ of 384,000-b-8,000) and 30 wt. % Compound B1 (PAA with $M_N$ of 5,700), the water contact angle was about 115.1°, less hydrophobic than the large-pore nanomask sample but more hydrophobic than the control sample. The water contact angle data were consistent with a conclusion that the introduction of nanopillar structures to an otherwise substantially flat surface can further increase surface hydrophobicity of the surface.

It should be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method for fabricating a nanopillared surface, the method comprising:
providing a nanomask prepared by:
applying a polymer solution to a nanomask-substrate surface of a nanomask substrate, the polymer solution containing:
an amphiphilic block copolymer having hydrophobic blocks and hydrophilic blocks, the hydrophobic blocks having a number-average molecular weight of from about 100,000 Dalton to about 500,000 Dalton;
a hydrophilic homopolymer that is chemically compatible with the hydrophilic blocks of the amphiphilic block copolymer; and
an application solvent;
evaporating the application solvent to form a self-assembled polymer layer defining a template surface opposite the nanomask substrate surface, the self-assembled polymer layer having hydrophobic domains adjacent to the nanomask substrate surface and hydrophilic domains extending into the self-assembled polymer layer from the template surface; and
removing at least a portion of the hydrophilic domains to form a plurality of pores in the self-assembled polymer layer having openings at the template surface;
applying a nanopillar-forming material to at least one replica-substrate surface of a replica substrate to form a precursor layer on the replica-substrate surface;
pressing the template surface of the nanomask onto the precursor layer;
curing the precursor layer while the template surface remains in contact with the precursor layer to form a cured precursor layer between the template surface and the replica-substrate surface; and
removing the nanomask to expose a nanopillared surface comprising a plurality of nanopillars on the replica-substrate surface, the plurality of nanopillars on the replica-substrate surface corresponding to the plurality of pores in the template surface.

2. The method of claim 1, wherein the nanopillar-forming material is perfluoroethertetraacrylate combined with a photoinitiator.

3. The method of claim 1, wherein at least one of the nanomask substrate and the replica substrate is glass.

4. The method of claim 1, wherein the replica substrate is glass and the nanopillar-forming material is a polydimethylsiloxane or perfluoroethertetraacrylate.

5. The method of claim 1, wherein the nanopillar-forming material is a UV-curable polymer and curing the precursor layer comprises exposing the precursor layer to UV radiation.

6. The method of claim 1, wherein the plurality of pores in the template surface have a mean pore diameter from about 100 nm to about 200 nm.

7. The method of claim 1, wherein the plurality of nanopillars have nanopillar heights from about 50 nm to about 150 nm.

8. The method of claim 1, wherein the weight ratio of the amphiphilic block copolymer to the hydrophilic homopolymer in the polymer solution is from about 1:1 to about 10:1.

9. The method of claim 1, wherein the amphiphilic block copolymer and the hydrophilic homopolymer have polydispersity indices of from 1.00 to about 1.20.

10. The method of claim 1, wherein the amphiphilic block copolymer comprises a PS-b-PEO block copolymer having polystyrene hydrophobic blocks and polyethylene oxide hydrophilic blocks.

11. The method of claim 1, wherein the hydrophilic homopolymer comprises poly(acrylic acid).

12. The method of claim 1, wherein: the amphiphilic block copolymer comprises a PS-b-PEO block copolymer comprising polystyrene hydrophobic blocks and polyethylene oxide hydrophilic blocks; and the hydrophilic homopolymer comprises poly(acrylic acid).

13. The method of claim 12, wherein the application solvent comprises tetrahydrofuran.

14. A method for fabricating a nanopillared glass substrate surface having antismudge or antireflective properties, the method comprising:
prov一ding a nanomask prepared by:
applying a polymer solution to a nanomask-substrate surface of a nanomask substrate, the polymer solution containing:
a PS-b-PEO block copolymer having polystyrene hydrophobic blocks and polyethylene oxide hydrophilic blocks, the polystyrene hydrophobic blocks having a number-average molecular weight from 100,000 Dalton to 500,000 Dalton;
a poly(acrylic acid) homopolymer having a number-average molecular weight of from 2000 Dalton to 30,000 Dalton; and
an application solvent;
evaporating the application solvent to form a self-assembled polymer layer defining a template surface opposite the nanomask substrate surface, the self-assembled polymer layer having hydrophobic domains adjacent to the nanomask substrate surface and hydrophilic domains extending into the self-assembled polymer layer from the template surface;
removing at least a portion of the hydrophilic domains to form a plurality of pores in the self-assembled polymer layer having openings at the template surface;
applying a nanopillar-forming material to at least one substrate surface of a glass substrate to form a precursor layer on the substrate surface, the nanopillar-forming material comprising a polydimethylsiloxane or a perfluoroethertetraacrylate;
pressing the template surface of the nanomask onto the precursor layer;
curing the precursor layer while the template surface remains in contact with the precursor layer to form a cured precursor layer between the template surface and the substrate surface; and
removing the nanomask to expose a nanopillared surface comprising a plurality of nanopillars on the substrate surface that impart antismudge or antireflective properties to the substrate surface, the plurality of nanopillars on the substrate surface corresponding to the plurality of pores in the template surface.

15. The method of claim 14, wherein the nanopillared surface exhibits a water contact angle greater than 110°.

16. The method of claim 14, wherein the PS-b-PEO block copolymer comprises from 60 wt. % to 98 wt. % polystyrene hydrophobic blocks and from 2 wt. % to 40 wt. % polyethylene oxide hydrophilic blocks, based on the total weight of the PS-b-PEO block copolymer.

17. The method of claim 14, wherein: the plurality of pores in the template surface have a mean pore diameter from about 100 nm to about 200 nm; and the plurality of nanopillars have nanopillar heights from about 50 nm to about 150 nm.

\* \* \* \* \*